United States Patent
Akahane et al.

(10) Patent No.: US 9,830,403 B2
(45) Date of Patent: Nov. 28, 2017

(54) COMMUNICATION APPARATUS, AND CAM FAILURE DIAGNOSIS METHOD

(71) Applicant: ALAXALA Networks Corporation, Kanagawa (JP)

(72) Inventors: Shinichi Akahane, Kawasaki (JP); Kazuo Sugai, Kawasaki (JP); Tomohiko Kouno, Kawasaki (JP); Takao Nara, Yokohama (JP)

(73) Assignee: Alaxala Networks Corporation, Kanagawa (JP)

( * ) Notice: Subject to any disclaimer, the term of this patent is extended or adjusted under 35 U.S.C. 154(b) by 310 days.

(21) Appl. No.: 14/579,132

(22) Filed: Dec. 22, 2014

(65) Prior Publication Data
US 2015/0242534 A1  Aug. 27, 2015

(30) Foreign Application Priority Data

Feb. 25, 2014 (JP) .................... 2014-034068

(51) Int. Cl.
G06F 11/00 (2006.01)
G06F 17/30 (2006.01)
G11C 15/00 (2006.01)
G11C 29/56 (2006.01)
G11C 29/04 (2006.01)

(52) U.S. Cl.
CPC ........ *G06F 17/30982* (2013.01); *G11C 15/00* (2013.01); *G11C 29/56008* (2013.01); *G11C 2029/0401* (2013.01)

(58) Field of Classification Search
CPC ......... H04L 12/5601; H04L 2012/5651; H04L 2012/5652; H04L 2012/5656; H04L 45/50; H04L 45/7453; H04L 47/10; H04L 47/20; H04L 47/2441
See application file for complete search history.

(56) References Cited

U.S. PATENT DOCUMENTS 5,535,164 A * 7/1996 Adams ........... G01R 31/318527
365/201
6,543,016 B1 * 4/2003 Lewandowski ........ G11C 29/02
711/108

(Continued)

FOREIGN PATENT DOCUMENTS

JP   2000-020533 A   1/2000
JP   2005-117171 A   4/2005

*Primary Examiner* — Bryce Bonzo
*Assistant Examiner* — Jeison C Arcos
(74) *Attorney, Agent, or Firm* — Mattingly & Malur, PC

(57) ABSTRACT

A communication apparatus comprises a CAM, an action determination unit, and a CAM diagnosis unit. The CAM includes, a plurality of entries each storing therein at least a portion of header information of frame, and a search circuit for each entry configured to determine whether or not a search key matches data stored at the entry. The search key is correlated with information indicating whether or not an entry matching the search key and an expected value of a search result including identification information of an entry matching the search key. The CAM diagnosis unit causes the CAM to search for an entry matching the search key. The CAM diagnosis unit diagnoses a failure occurring at the search circuit of an entry to be the test object when the result of the search does not match the expected value of a search result correlated to the search key.

15 Claims, 16 Drawing Sheets

(56) References Cited

U.S. PATENT DOCUMENTS

| | | | | |
|---|---|---|---|---|
| 6,658,002 B1* | 12/2003 | Ross | ............ | H04L 45/50 |
| | | | | 370/392 |
| 7,130,230 B2* | 10/2006 | Jain | ............ | G11C 29/38 |
| | | | | 365/201 |
| 7,484,145 B1* | 1/2009 | Hushyar | ............ | H04L 43/50 |
| | | | | 714/724 |
| 7,920,398 B1* | 4/2011 | Khanna | ............ | G11C 7/12 |
| | | | | 365/49.1 |
| 2003/0051197 A1* | 3/2003 | Evans | ............ | G11C 29/12 |
| | | | | 714/718 |
| 2005/0074009 A1 | 4/2005 | Kanetake et al. | | |
| 2006/0224822 A1* | 10/2006 | Blomquist | ............ | H04L 12/5601 |
| | | | | 711/108 |
| 2006/0233011 A1* | 10/2006 | Matsuoka | ............ | G06F 7/74 |
| | | | | 365/49.17 |
| 2007/0260814 A1* | 11/2007 | Branscome | ............ | G11C 15/00 |
| | | | | 711/108 |
| 2013/0124707 A1* | 5/2013 | Ananthapadmanabha | ............ | H04L 45/7457 |
| | | | | 709/223 |

* cited by examiner

TEST PATTERN

| PATTERN ID | DATA PATTERN | SEARCH KEY PATTERN | EXPECTED VALUE OF SEARCH RESULT | |
|---|---|---|---|---|
| | | | HIT/NO HIT | HIT ENTRY ADDRESS |
| P1 | 100...0 | 100...0 | HIT | TEST ENTRY e |
| P2 | 100...0 | 111...1 | NO HIT | - |
| P3 | 111...1 | 100...0 | NO HIT | - |
| P4 | 111...1 | 111...1 | HIT | TEST ENTRY e |
| P5 | 1XX...X | 100...0 | HIT | TEST ENTRY e |
| P6 | 1XX...X | 111...1 | HIT | TEST ENTRY e |
| P7 | 101...1 | 101...1 | HIT | TEST ENTRY e |
| P8 | 101...1 | 110...0 | NO HIT | - |
| P9 | 110...0 | 101...1 | NO HIT | - |
| P10 | 110...0 | 110...0 | HIT | TEST ENTRY e |
| P11 | 1XX...X | 101...1 | HIT | TEST ENTRY e |
| P12 | 1XX...X | 110...0 | HIT | TEST ENTRY e |
| P13 | 1X0...X0 | 100...00 | HIT | TEST ENTRY e |
| P14 | 1X0...X0 | 110...10 | HIT | TEST ENTRY e |
| P15 | 1X0...X0 | 101...01 | NO HIT | - |
| P16 | 1X0...X0 | 111...11 | NO HIT | - |
| P17 | 1X1...X1 | 100...00 | NO HIT | - |
| P18 | 1X1...X1 | 110...10 | NO HIT | - |
| P19 | 1X1...X1 | 101...01 | HIT | TEST ENTRY e |
| P20 | 1X1...X1 | 111...11 | HIT | TEST ENTRY e |
| P21 | 10X...0X | 100...00 | HIT | TEST ENTRY e |
| P22 | 10X...0X | 110...10 | NO HIT | - |
| P23 | 10X...0X | 101...01 | HIT | TEST ENTRY e |
| P24 | 10X...0X | 111...11 | NO HIT | - |
| P25 | 11X...1X | 100...00 | NO HIT | - |
| P26 | 11X...1X | 110...10 | HIT | TEST ENTRY e |
| P27 | 11X...1X | 101...01 | NO HIT | - |
| P28 | 11X...1X | 111...11 | HIT | TEST ENTRY e |

FIG. 4

CAM TEST RESULT LOG

| FAULT DETECTION ENTRY (501) | PATTERN ID (502) | DATA PATTERN (503) | SEARCH KEY PATTERN (504) | EXPECTED VALUE OF SEARCH RESULT (505) | | SEARCH RESULT (506) | |
|---|---|---|---|---|---|---|---|
| | | | | HIT/NO HIT (507) | HIT ENTRY ADDRESS (508) | HIT/NO HIT (509) | HIT ENTRY ADDRESS (510) |
| e1 | P1 | 100...0 | 100...0 | HIT | TEST ENTRY e | NO HIT | - |

*FIG. 8*

CAM TEST RESULT LOG

| FAULT DETECTION ENTRY | PATTERN ID | DATA PATTERN | SEARCH KEY PATTERN | EXPECTED VALUE OF SEARCH RESULT | | SEARCH RESULT | |
|---|---|---|---|---|---|---|---|
| | | | | HIT/NO HIT | HIT ENTRY ADDRESS | HIT/NO HIT | HIT ENTRY ADDRESS |
| e1 | P1 | 100...0 | 100...0 | HIT | TEST ENTRY e | NO HIT | - |
| e1 | P2 | 100...0 | 111...1 | NO HIT | - | HIT | e1 |
| e2 | P3 | 111...1 | 100...0 | NO HIT | - | HIT | e2 |
| e3 | P4 | 111...1 | 111...1 | HIT | TEST ENTRY e | NO HIT | - |
| e4 | P5 | 1XX...X | 100...0 | HIT | TEST ENTRY e | NO HIT | - |

*FIG. 10*

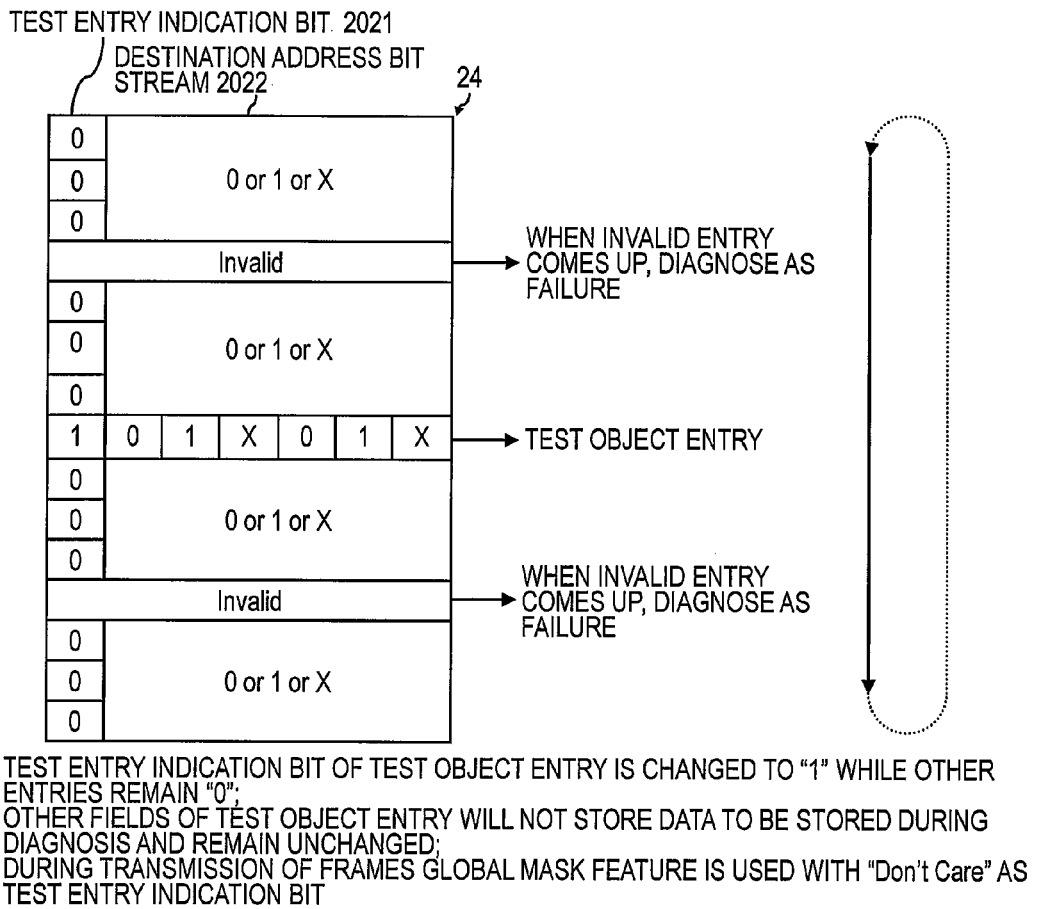

TEST ENTRY INDICATION BIT OF TEST OBJECT ENTRY IS CHANGED TO "1" WHILE OTHER ENTRIES REMAIN "0";
OTHER FIELDS OF TEST OBJECT ENTRY WILL NOT STORE DATA TO BE STORED DURING DIAGNOSIS AND REMAIN UNCHANGED;
DURING TRANSMISSION OF FRAMES GLOBAL MASK FEATURE IS USED WITH "Don't Care" AS TEST ENTRY INDICATION BIT

GENERATION OF SEARCH KEY (1) SEARCH KEY HAVING "0" FOR "X" BIT OF TEST OBJECT ENTRY
EXPECTED VALUE OF SEARCH RESULT: HIT ENTRY ADDRESS OF TEST OBJECT ENTRY (2) SEARCH KEY HAVING "1" FOR "X" BIT OF TEST OBJECT ENTRY
EXPECTED VALUE OF SEARCH RESULT: HIT ENTRY ADDRESS OF TEST OBJECT ENTRY (3) SEARCH KEY HAVING "0" OR "1" BITS OF TEST OBJECT ENTRY INVERTED
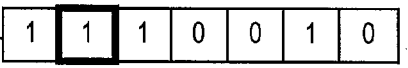
EXPECTED VALUE OF SEARCH RESULT: NO HIT
EXPECTED VALUE OF SEARCH RESULT: NO HIT
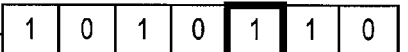
EXPECTED VALUE OF SEARCH RESULT: NO HIT
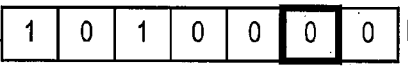
EXPECTED VALUE OF SEARCH RESULT: NO HIT

FIG. 11

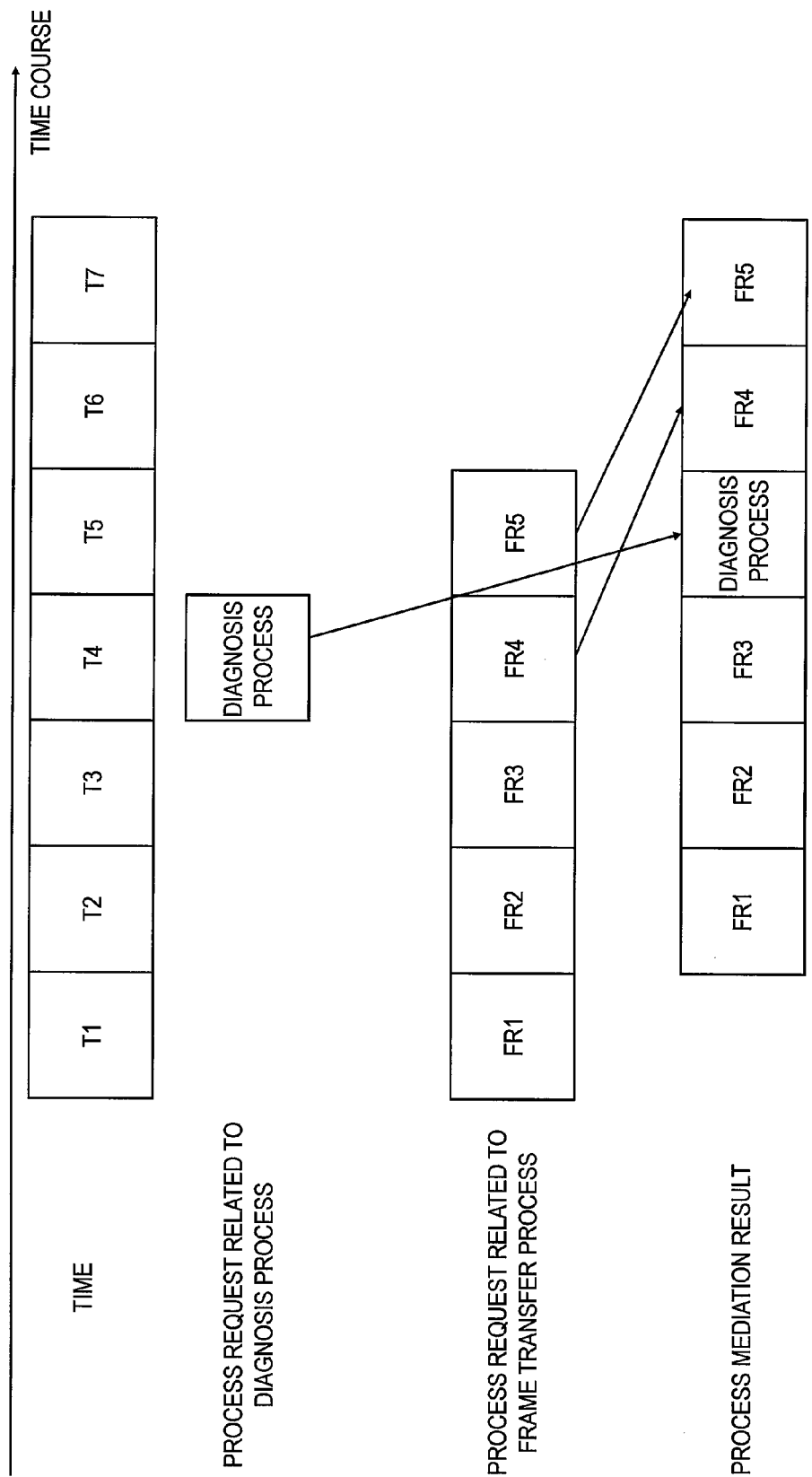

COMMUNICATION APPARATUS, AND CAM FAILURE DIAGNOSIS METHOD

CLAIM OF PRIORITY

The present application claims priority from Japanese patent application JP 2014-34068 filed on Feb. 25, 2014, the content of which is hereby incorporated by reference into this application.

BACKGROUND

The present invention relates to a communication apparatus configured to transmit and receive frames. More particularly, the present invention relates to a communication apparatus configured to diagnose failures occurring at a CAM (Contents Addressable Memory) configured to conduct high speed table search.

Japanese Patent Publication No. 2005-117171 (Patent Document 1) and Japanese Patent Publication No. 2000-20533 (Patent Document 2) disclose the background technology of the present field. Patent Document 1 discloses the following description: "The packet transfer apparatus is provided with a search key storage section 101 for storing a searching key relative to a packet transfer destination and collation information generated by the searching key in cross-reference with a storage address of the transfer information stored in a transfer information storage section 104, a transmission information acquisition section 103 uses the searching key generated on the basis of header information and the collation information generated from the searching key to search a searching key storage section 101, and when they are coincident with the searching key and the collation information stored in the searching key storage section 101, the transmission information acquisition section 103 acquires the storage position information of the transfer information from the searching key storage section 101, acquires the transfer information stored in the transfer information storage section 104 on the basis of the acquired storage address information and a transfer section 106 transfers packets on the basis of the acquired transfer information." (See "Abstract").

Patent Document 2 discloses the following description: "The fault detector is provided with a CAM 1 for outputting a retrieval coincidence flag when data coincident with retrieving data are stored, an address generation part 2 for connecting a retrieval coincidence address to the address input of the CAM 1 in accordance with a retrieval instruction from the external and the retrieval coincidence flag and a data generation part 3 for connecting the retrieving data to the data input of the CAM in accordance with the retrieval coincidence flag and constituted so as to judge a fault in the retrieving circuit by comparing, in a comparison part 4, data stored in the retrieval coincidence address of the CAM 1 with the retrieving data generated from the data generation part 3." (See "Abstract").

[Patent Document 1] Japanese Patent Publication No. 2005-117171
[Patent Document 2] Japanese Patent Publication No. 2000-20533

SUMMARY

The technology disclosed in Patent Document 1 is designed to prevent erroneous transmission of packets by information verification which prevents erroneous acquisition of transmission information even when a software error occurring at the location information stored at the search key storage unit alters the stored data. However, this technology is not designed to determine whether or not a failure is occurring at a CAM (search key storage unit).

The technology disclosed in Patent Document 2 is designed to detect a malfunction occurring at the search circuit of a CAM. However, since the CAM according to Patent Document 2 is designed to make a comparison between the data retained at an address matching a search by the CAM and the search data from the data generation unit 3, when there are multiple entries matching the search key for reasons such as the search key being masked, or the like, a malfunction occurring at any one of the search circuits of the multiple entries will not be detected.

For example, when each entry includes its own mask such as a route search, or when each field of an entry includes its own validity for search standard, it is likely that there are multiple entries matching a search key.

The purpose of the present invention is to provide a communication apparatus operable to detect a failure occurring at a CAM search circuit even when there are multiple entries matching a search key.

To provide a typical example of the present invention, there is provided A communication apparatus configured to transmit and receive a frame comprising: a CAM configured to retain at least a portion of header information of the frame; an action determination unit configured to refer to the CAM and determine an action related to transferring the received frame; and a CAM diagnosis unit configured to diagnose a failure at the CAM, wherein the CAM includes, a plurality of entries each storing therein at least a portion of the header information of the frame, and a search circuit for each entry configured to determine whether or not a search key matches data stored at the entry, wherein, in a case of receiving the frame, the action determination unit uses as a search key at least a portion of the header information of the frame and determines an action related to transferring the received frame based on identification information of an entry matching at least a portion of the header information of the frame, wherein the CAM diagnosis unit determines an entry to be test object, wherein the search key for a test purpose is correlated with information indicating whether or not an entry matching the search key for a testing purpose and an expected value of a search result including identification information of an entry matching the search key for a test purpose, wherein the CAM diagnosis unit causes the CAM to search for an entry matching the search key for a test purpose, wherein the CAM diagnosis unit determines whether or not a result of the search matches the expected value of a search result correlated to the search key for a test purpose, and wherein the CAM diagnosis unit diagnoses a failure occurring at the search circuit of an entry to be the test object in a case where it is determined the result of the search does not match the expected value of a search result correlated to the search key for a test purpose.

The effects obtained by a typical example of the inventions disclosed herein will be described in a concise manner as below. This invention enables to provide a communication apparatus operable to detect a failure occurring at a CAM search circuit even when there are multiple entries matching a search key.

Other objects, configurations, and effects than those described above are revealed in the following description of an embodiment.

BRIEF DESCRIPTION OF THE DRAWINGS

The present invention can be appreciated by the description which follows in conjunction with the following figures, wherein:

FIG. 4 is an explanatory diagram illustrating a CAM test pattern;

FIG. 8 is an explanatory diagram illustrating a CAM test result log according to embodiment 1;

FIG. 10 is an explanatory diagram illustrating the CAM test result log according to the first modification of embodiment 1;

FIG. 11 is an explanatory diagram illustrating a summary of the CAM failure diagnosis process according to a second modification of embodiment 1;

FIG. 12 is and explanatory diagram illustrating a mediation between the frame transfer process and the CAM failure diagnosis process according to a third modification of embodiment 1;

DETAILED DESCRIPTION OF THE EMBODIMENTS

Embodiment 1

Figure 1:
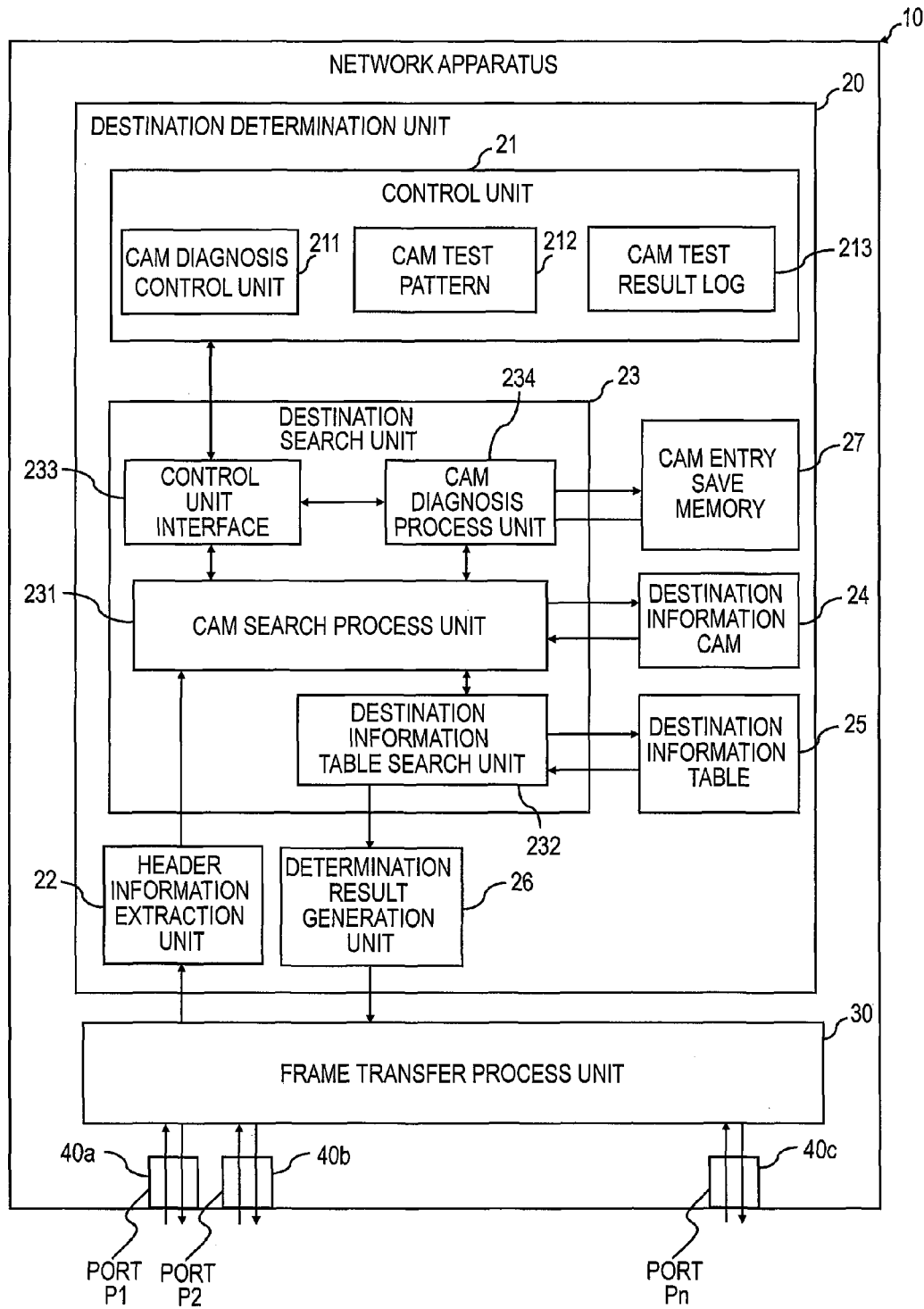
FIG. 1 is an explanatory diagram illustrating a network apparatus according to embodiment 1.

Embodiment 1 of the present invention will be described with reference to FIG. 1 through FIG. 8. FIG. 1 is an explanatory diagram illustrating a network apparatus 10 according to embodiment 1.

The network apparatus 10 includes a destination determination unit 20, a frame transfer process unit 30, and a plurality of ports 40*a*, 40*b* through 40*n*. Note that the number of the ports 40*a*, 40*b* through 40*n* arranged at the network apparatus 10 is not limited to the number of those as illustrated in FIG. 1; the network apparatus 10 may include at least one of the ports 40*a*, 40*b* through 40*n*. Also note that the ports 40*a*, 40*b* through 40*n* may collectively be referred to as a port 40 in the description herein.

The port 40, which is connected to the network, is an interface configured to transmit and receive frames with the network.

The frame transfer process unit 30 executes a predetermined reception process with respect to a frame received by the network apparatus 10, and outputs the frame, to which the reception process has been executed, to the destination determination unit 20.

The destination determination unit 20 determines a destination of the frame inputted from the frame transfer process unit 30, determines the port 40 corresponding to the destination, and outputs the frame to the frame transfer process unit 30.

The frame transfer process unit 30 executes a predetermined transmission process with respect to the frame inputted from the destination determination unit 20, and outputs, via the corresponding port 40, the frame to which the transmission process has been executed.

Hereinafter, the details of the destination determination unit 20 will be described.

The destination determination unit 20 includes a control unit 21, a header information extraction unit 22, a destination search unit 23, a destination information CAM (Contents Addressable Memory), a destination information table 25, a determination result generation unit 26, and a CAM entry save memory 27.

The header information extraction unit 22 extracts header information of a frame inputted from the frame transfer process unit 30, and outputs a search request including the extracted header information to a CAM search process unit 231 included at the destination search unit 23. Note that the header information includes an address (destination address) which is the destination of the frame. The destination address may include an IP address, for example.

The destination search unit 23 makes a determination as to whether or not the network apparatus 10 includes a port 40 that corresponds to the destination address included in the search request inputted from the header information extraction unit 22, and outputs the determination result to the determination result generation unit 26.

The destination information CAM 24 includes a plurality of entries operable to store therein information and a search circuit operable to determine for each entry whether a search key matches any of the information stored at the entries. The configuration of the destination information CAM 24 will be described in detail below with reference to FIG. 3. Each entry at the destination information CAM 24 includes its relationship with a destination address. The information stored at the entries of the destination information CAM 24 will be described in detail below with reference to FIG. 2.

The destination information table 25 registers therein the relationship between the entry address at the destination information CAM 24 and the identification information of the port 40 corresponding to the entry address. The details of the destination information table 25 will be described below with reference to FIG. 2. Note that the "entry address" of the destination information CAM 24 refers to the identification information of an entry matching a search key of the destination information CAM 24.

The determination result generation unit 26 outputs the determination result inputted from the destination search unit 23 to the frame transfer process unit 30.

The CAM entry save memory 27 is a storage area configured to temporarily save the data stored at an entry to be a test object (a test object entry) of the destination information CAM 24. Note that the CAM entry save memory 27 is not a component necessary for the configuration for embodiment 1, but will be used in embodiment 2 and embodiment 3.

Next, the destination unit 23 will be described.

The destination search unit 23 includes a CAM search process unit 231, a destination information table search unit 232, a control unit interface 233, and a CAM diagnosis process unit 234.

The CAM search process unit 231 outputs a search request which includes, as a search key, the destination address of the header information included in the search request inputted from the header information extraction unit 22 to the destination information CAM 24. When the determination result including the entry address is inputted from the destination information CAM 24, the CAM search process unit 231 outputs the determination result to the destination information table search unit 232.

When the determination result is inputted from the CAM search process unit 231, the destination information table search unit 232 refers to the destination information table 25, acquires output information which indicates the port 40 corresponding to the entry address included in the determination result, adds the output information in the determination result, and outputs the determination result to the determination result generation unit 26.

The control unit interface 233 is an interface connected to the control unit 21.

The CAM diagnosis process unit 234 causes the CAM search process unit 231 to diagnose, based on the instruction from a CAM diagnosis control unit 211 included at the control unit 21, whether or not a failure is occurring at the search circuit of the destination information CAM 24. Note that the CAM diagnosis control unit 211 and the CAM diagnosis process unit 234 will collectively be referred to as a CAM diagnosis unit.

The control unit 21, which controls the destination determination unit 20, includes a CAM diagnosis control unit 211, a CAM test pattern 212, and a CAM test result log 213. Note that the control unit 21 includes a processor and a memory which are not depicted in the drawing. The memory stores therein a program, the CAM test pattern 212, and the CAM test results log 213 which correspond to the CAM diagnosis control unit 211. When the processor executes a program corresponding to the CAM diagnosis control unit 211 stored at the memory, the CAM diagnosis control unit 211 is realized.

The CAM diagnosis control unit 211 executes a CAM diagnosis process to diagnose whether or not a failure is occurring at the search circuit at the destination information CAM 24. The CAM diagnosis process will be described in detail below with reference to FIG. 6 and FIG. 7.

The CAM test pattern 212 registers therein the correlation among data (data to be stored during diagnosis) to be written to the inspection object entry of the destination information CAM 24, a search key configured to correspond to the data to be stored during diagnosis, and an expected value of search result. The CAM test pattern 212 will be described in detail below with reference to FIG. 4.

The CAM test result log 213 is arranged to log failure as diagnosed by the CAM diagnosis process. The CAM test result log 213 will be described in detail with reference to FIG. 8.

Figure 2:
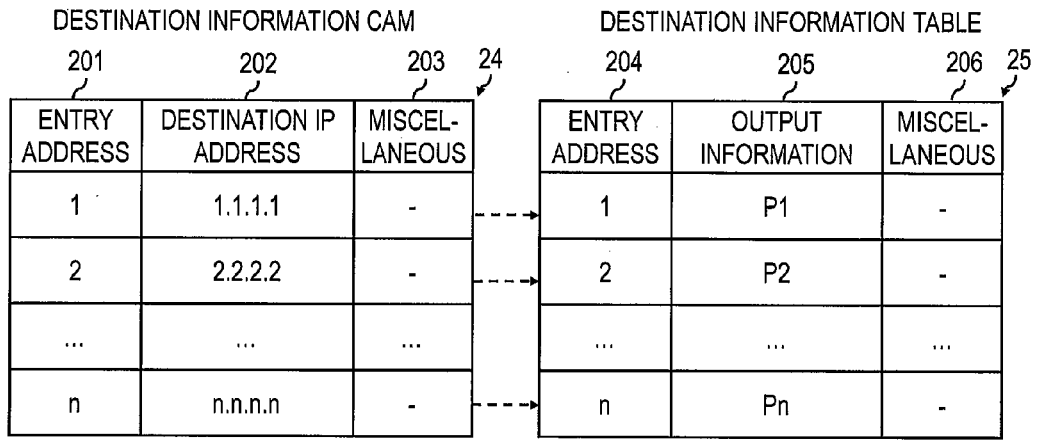
FIG. 2 is an explanatory diagram illustrating information stored at each entry of destination information CAM and the destination information table of embodiment 1.

FIG. 2 is an explanatory diagram illustrating the information stored at each entry of the destination information CAM 24 and the destination information table 25 of embodiment 1.

The destination information CAM 24 includes an entry address 201, a destination IP address 202, and a miscellaneous 203. Note that each entry of the destination information CAM 24 may only include the destination IP address 202.

The entry address 201 registers therein an entry address which is the identification information of the entries at the destination information CAM 24. The destination IP address 202 registers therein an IP address (destination address) to which a frame is sent. Note that the information registered at the destination IP address 202 may not be limited to IP address, but may include any address indicating a destination. The miscellaneous 203 registers therein information other than entry address and destination address.

For example, an entry, which is identified as "1" in FIG. 2, stores therein the destination address "1.1.1.1."

The destination information table 25 includes an entry address 204, an output information 205, and a miscellaneous 206.

The entry address 204 registers therein an entry address of the destination information CAM 24. The output information 205 registers therein identification information (output information) of the port 40 from which an output will be executed. The miscellaneous 206 registers therein information other than entry address and output information.

For example, the entry address "1" registers therein output information "P1." The destination address and the output information are correlated to one another via the entry address of the destination information CAM 24. Accordingly, the destination search unit 23 acquires an entry address which matches the destination address of a frame received from the destination information CAM 24, refers to the destination information table 25, and makes a determination on the output information corresponding to the acquired entry address.

Since the destination information CAM 24 is operable to search for an entry address matching a destination address at a high speed, by having the above stated configuration, it becomes possible to realize a high speed search of the output information using destination address as a search key.

Figure 3:
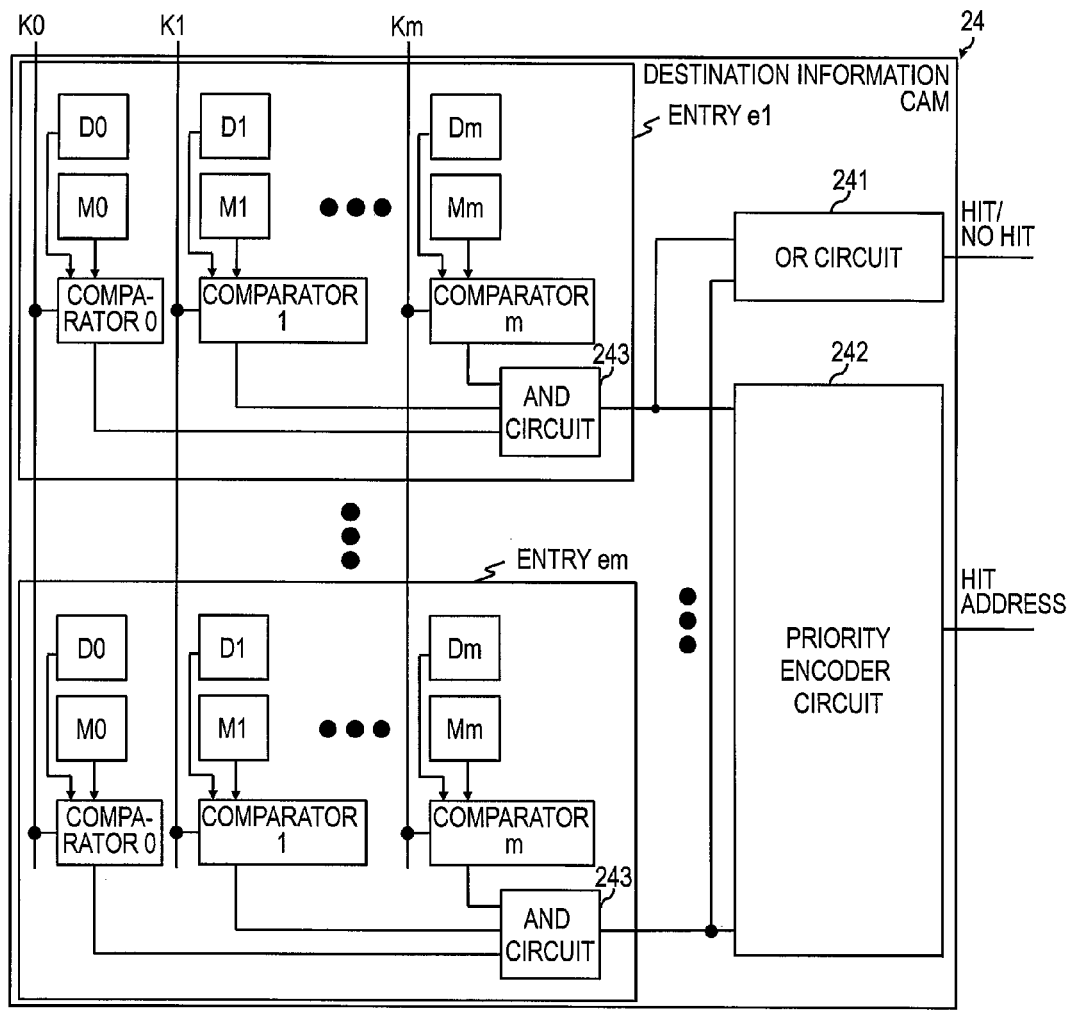
FIG. 3 is a hardware configuration diagram of the destination information CAM according to embodiment 1.

FIG. 3 is a hardware configuration diagram of the destination information CAM 24 according to embodiment 1.

The destination information CAM 24 includes a plurality of entries (entry e1 through entry em), an OR circuit 241, and a priority encoder circuit 242. Note that the number of the entries is not limited to the number of the entries as illustrated in FIG. 3. The destination information CAM 24 may only include 1 entry. Note that the entries e1 through em may collectively be referred to as an entry.

Each entry stores therein a destination address.

Each entry includes data bits D0 through Dm, mask bits M0 through Mm, comparators 0 though m, and an AND circuit 243.

The data bits D0 through Dm each include therein a bit stream indicating a destination address. The mask bits M0 through Mm each include a bit which indicates whether or not to mask the corresponding data bits D0 through Dm.

The comparators 0 though m compare each search key bit inputted through search key bit input lines K0 through K1 with each data bit D0 through Dm in order to determine as to whether or not each search key bit matches each data bit D0 through Dm, and output a determination result to the AND circuit 243. To be more specific, the comparators 0 through m output "1" to the AND circuit 243 when each search key bit matches each data bit D0 through Dm, and output "0" to the AND circuit 243 when each search key bit does not match each data bit D0 through Dm.

Further, the comparators 0 through m output the determination result ("1") to the AND circuit 243 without comparing each search key bit with each data bit D0 through Dm when each mask bit M0 through Mm is "1."

The AND circuit 243 outputs a logical product of the determination result inputted from the comparators 0 through m to the OR circuit 241 and the priority encoder circuit 242. When the determination result ("1") indicating the search key bits and the data bits D0 through Dm match from the comparators 0 through m, the AND circuit 243 outputs the logical product "1" to the OR circuit 241 and the priority encoder circuit 242. Note that the logical products "1" indicates that a search key and the destination address stored at an entry matches. The AND circuit 243 outputs a logical product "0" to the OR circuit 241 and the priority encoder circuit 242 when the AND circuit 243 receives from at least one of the comparators 0 through m a determination result ("0") indicating the search key bits and the data bits D0 through Dm do not match. Note that the logical product "0" indicates that a search key and the destination address stored at an entry do not match.

Note that the comparators 0 through m and the AND circuit 243 of each of the entries e1 through em comprise a search circuit corresponding to each entry, e1 through em.

The OR circuit 241 calculates a logical sum from the AND circuit 243 of each entry, e1 through em, and outputs the calculated logical sum to the CAM search process unit 231. A logical sum of "1" indicates that an entry matching a search key exists, whereas a logical sum of "0" indicates that an entry matching a search key does not exist.

The priority encoder circuit 242 outputs an entry address to the CAM search process unit 231 when an entry matching a key search exists. Note that when multiple entries matching a key search exist, the priority encoder circuit 242 outputs an entry address whose entry address is the smallest, for example.

FIG. 4 is an explanatory diagram illustrating the CAM test pattern 212 according to embodiment 1.

The CAM test pattern 212 includes a pattern ID 401, a data pattern 402, a search key pattern 403, and an expected value of search result 404.

The pattern ID 401 registers therein a pattern ID which is the identification information of a pattern. The data pattern 402 registers therein data to be stored during diagnosis stored at an entry which is a test object. The search key pattern 403 registers therein a search key used for tests.

The expected value of search result 404 registers therein a search result when the data to be stored during diagnosis registered in the data pattern 402 is stored at the test object entry, and when a search is conducted at the destination information CAM 24 using a search key for test purpose registered at the search key pattern 403. To be more specific, the expected value of search result 404 includes a hit/no-hit 405 and a hit entry address 406. The hit/no hit 405 registers therein information indicating whether or not an entry matching a search key used for test exists, whereas the hit entry address 406 registers therein an entry address of an entry matching a search key used for test when information ("hit") indicating that an entry matching a search key used for test exists is registered the hit/no hit 405.

Note that a bit at the first digit of the data to be stored during diagnosis registered in the data pattern 402 is always "1." The bit at the first digit includes test entry identification information indicating the test object entry. The bit at the first digit of a non-test object entry is "0." Further, the first digit of a search key for test registered at the search key pattern 403 is "1." Accordingly, since the entry of the destination information CAM 24 matching the search key for test becomes the test object entry, the hit entry address 406 includes the entry address of the test object entry registered therein.

Note that the bit at the first digit for the search key for test may be "0."

Figure 5:
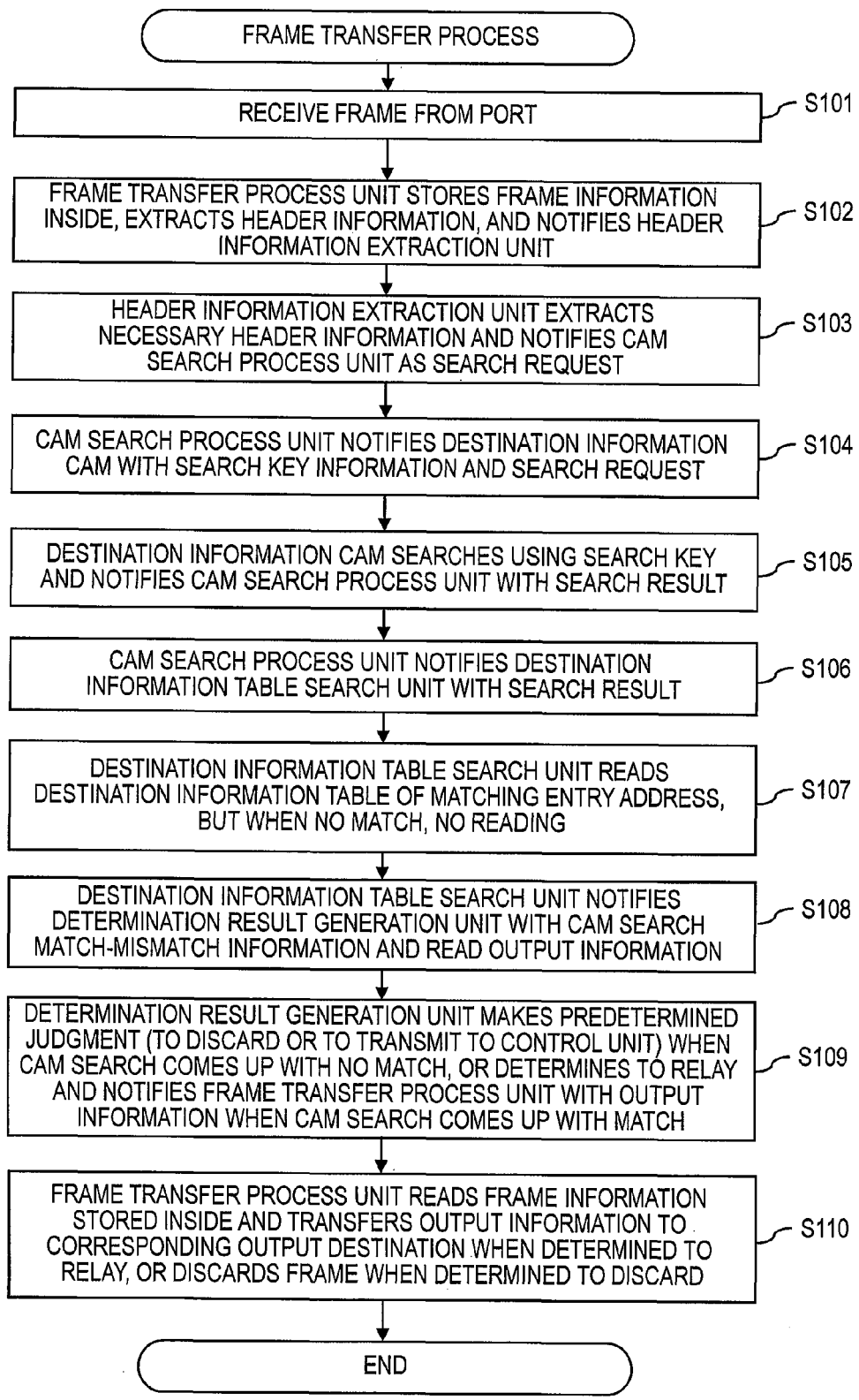
FIG. 5 is a flowchart illustrating a frame transfer process as executed by the network apparatus according to embodiment 1.

FIG. 5 is a flowchart illustrating a frame transfer process as executed by the network apparatus 10 according to embodiment 1.

When the network apparatus 10 receives a frame via the port 40 (S101), the network apparatus 10 executes a frame transfer process. When the frame is inputted via the port 40, the frame transfer process unit 30 stores the inputted frame, extracts header information from the inputted frame, and outputs the extracted header information to the header information extraction unit 22 (S102).

When the header information is inputted, the header information extraction unit 22 extracts necessary header information (e.g., destination address, etc.) from the inputted header information, and outputs the extracted header information as a search request to the CAM search process unit 231 (S103).

When the search request is inputted, the CAM search process unit 231 outputs a search request which includes the destination address included in the search request inputted from the header information extraction unit 22 as search key information to the destination information CAM 24 (S104).

When the search request is inputted from the CAM search process unit 231, the destination information CAM 24 searches each entry by using the search key information included in the inputted search request, and outputs a search result to the CAM search process unit 231 (S105). When an entry matching the search key information exists, the search result outputted to the CAM search process unit 231 includes information indicating that an entry matching the search key information exists and an entry address of the entry matching the search key information. On the other hand, when an entry matching the search key information does not exist, the search result includes information indicating that an entry matching the search key information does not exist.

When the search result is inputted, the CAM search process unit 231 outputs the inputted search result to the destination information table search unit 232 (S106).

When the search result includes the information indicating an entry matching the search key information exists, the destination information table search unit 232 refers to the correlation between the entry address and the output information, and acquires the output information corresponding to the entry address (S107). To be more specific, the destination information table search unit 232 refers to the destination information table 25 in order to acquire the output information of a record in which the entry address 204 registers therein an entry address of the matching entry. On the other hand, when the search result includes the information indicating an entry matching the search key information does not exist, the destination information table search unit 232 will not refer to the destination information table 25.

Next, the destination information table search unit 232 outputs CAM search match-mismatch information, which indicates whether or not an entry matching search key information exists at the destination information CAM 24 and the output information acquired during S107 to determination result generation unit 26 (S108).

When the CAM search match/mismatch information indicates no matching entry exists at the destination information CAM 24, determination result generation unit 26 makes a predetermined determination and outputs a determination result to the 30 (S109). Note that the predetermination determination includes at least one of a determination to discard the received frame and a determination to notify the control unit 21 that no matching entry exists at the destination information CAM 24. On the other hand, when the CAM search match/mismatch information indicates a matching entry exists at the destination information CAM 24, determination result generation unit 26 determines to relay information and outputs the determination result and the output information to the 30.

When the determination result is inputted and the inputted determination result includes the relay determination, the 30 reads out the frame information stored during S102, transfers the frame information read out to the port 40 corresponding to the output information (S110), and ends the process. On the other hand, when the inputted determination result includes the discard determination, the 30 discards the frame information stored during S102, and ends the process.

By the process above, the network apparatus 10 transfers the received frames in accordance with the destination address.

Figure 6:
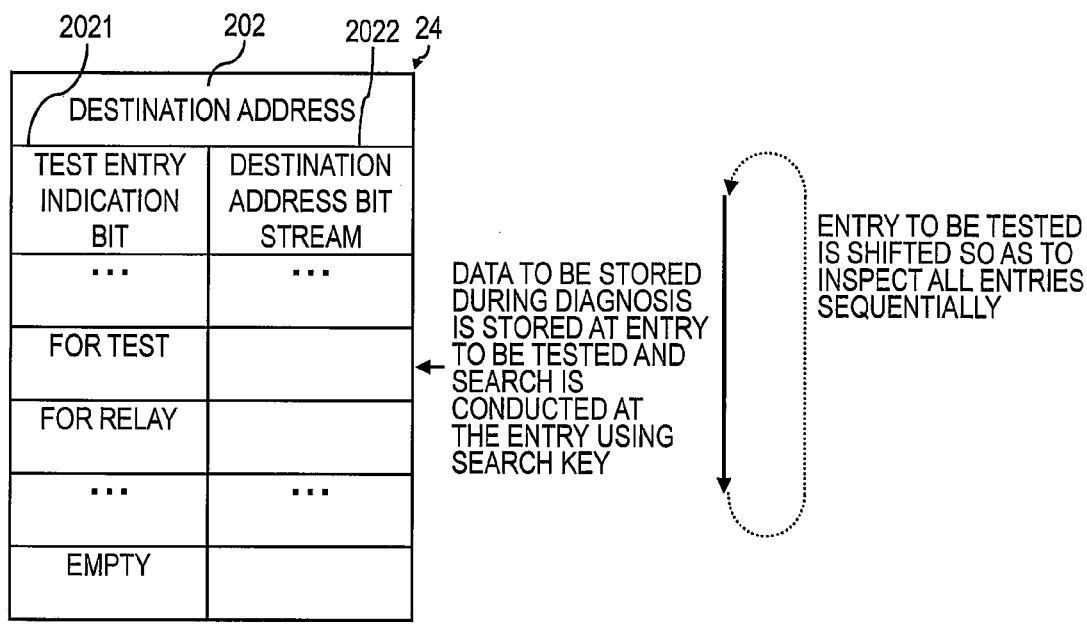
FIG. 6 is an explanatory diagram illustrating a summary of a CAM diagnosis process according to embodiment 1.

FIG. 6 is an explanatory diagram illustrating a summary of the CAM diagnosis process according to embodiment 1.

Each entry at the destination information CAM 24 includes a destination IP address 202 (See FIG. 2). The destination IP address 202 includes a test entry indication bit 2021 and a destination address bit stream 2022. The destination IP address 2021 includes therein information indicating whether an entry is for test or for relay. When the entry is to be a test object, the test entry indication bit 2021 registers therein information (for example, "1") indicating the entry is for test, whereas when the entry is not to be a test object, the destination bit stream 2022 registers therein information (for example "0")indicating the entry is for relay. The destination address bit stream 2022 registers therein the IP address which is an address of a frame as described above with reference to FIG. 2.

The data to be stored during diagnosis which is used to diagnose CAM failure will be stored at the destination address bit stream 2022 of the entry, whose test object entry indication bit 2021 registers therein the information indicating that the entry is for test. Further, a predetermined search key which corresponds to the data to be stored during diagnosis which is stored at the destination address bit stream 2022 is inputted to the destination information CAM 24 in order to execute a CAM failure diagnosis process using the predetermined search key. Note that the data to be stored during diagnosis is registered at the data pattern 402 of the test pattern 212 which was described with reference to FIG. 4.

Also note the search key is registered at the search key pattern 403 of the test pattern 212 which was described with reference to FIG. 4. It is to be noted that if a test object entry which stores therein the data to be stored during diagnosis is referred to during a frame relay an erroneous transfer of the frame may take place. Accordingly, in order to prevent such erroneous transfers, an entry whose test entry indication bit 2021 is registered with information indicating this entry is for test will not be referred to during a/the frame transfer process in the event of the network apparatus 10 receiving a frame, but will be referred to only when its test entry indication bit 2021 is registered with information indicating that the entry is for relay. By virtue of such configuration, it is possible to prevent erroneous transfers of frames wherein an entry already having stored therein the data to be stored during diagnosis is found to be matching the destination address of a frame.

Hereinafter, the details of the CAM diagnosis process will be described.

First, the CAM diagnosis process unit 214 executes the CAM failure diagnosis process at a predetermined timing. An entry to be a test object is determined from the entries of the destination information CAM 24, wherein the data stored all the entries configured after the entry to a test object is stored (shifted) at an entry address one ahead of the all the entries configured after the entry to a test object respectively. By this, the entry to be a test object will have no data stored therein. Further, after storing the data stored at each entry configured after the entry to be a test object at an entry address configured one ahead of each entry address, the 214 increments each entry address configured after the entry to be a test object in the destination information table 25. By this, even after the data stored at each entry configured after the entry to be a test object for the destination information CAM 24 has been shifted to an entry address configured one ahead, said data will be correlated with the entry address at the destination information table 25.

Next, the 214 refers to the CAM test pattern 212 in order to determine a test object test pattern, stores the information indicating the entry is for test at the test entry indication bit 2021 of the test object entry, stores the date registered at the data pattern 402 of the test object test pattern at the destination address bit stream 2022 of the entry to be a test object, and outputs the search request including the search key registered at the search key pattern 403 of the test object test pattern to the CAM diagnosis process unit 234. The CAM diagnosis process unit 234 outputs the inputted search request to the CAM search process unit 231, then the CAM search process unit 231 outputs the inputted search request to the destination information CAM 24. When the search request is inputted, the destination information CAM 24 makes a determination as to whether or not an entry matching the search key for test exists in the same manner as in the frame transfer process, and outputs the determination result to the CAM search process unit 231. The CAM search process unit 231 outputs the determination result to the CAM diagnosis control unit 211 via the CAM diagnosis process unit 234. The CAM diagnosis control unit 211 makes a determination as to whether or not the inputted determination result matches the expected value of search result of the test object test pattern.

When all the test patterns have been executed with respect to the test object entry, another entry will be determined to be a new test object to which the CAM diagnosis process will be executed. When the CAM diagnosis process is executed to all the entries, the process ends.

Figure 7:
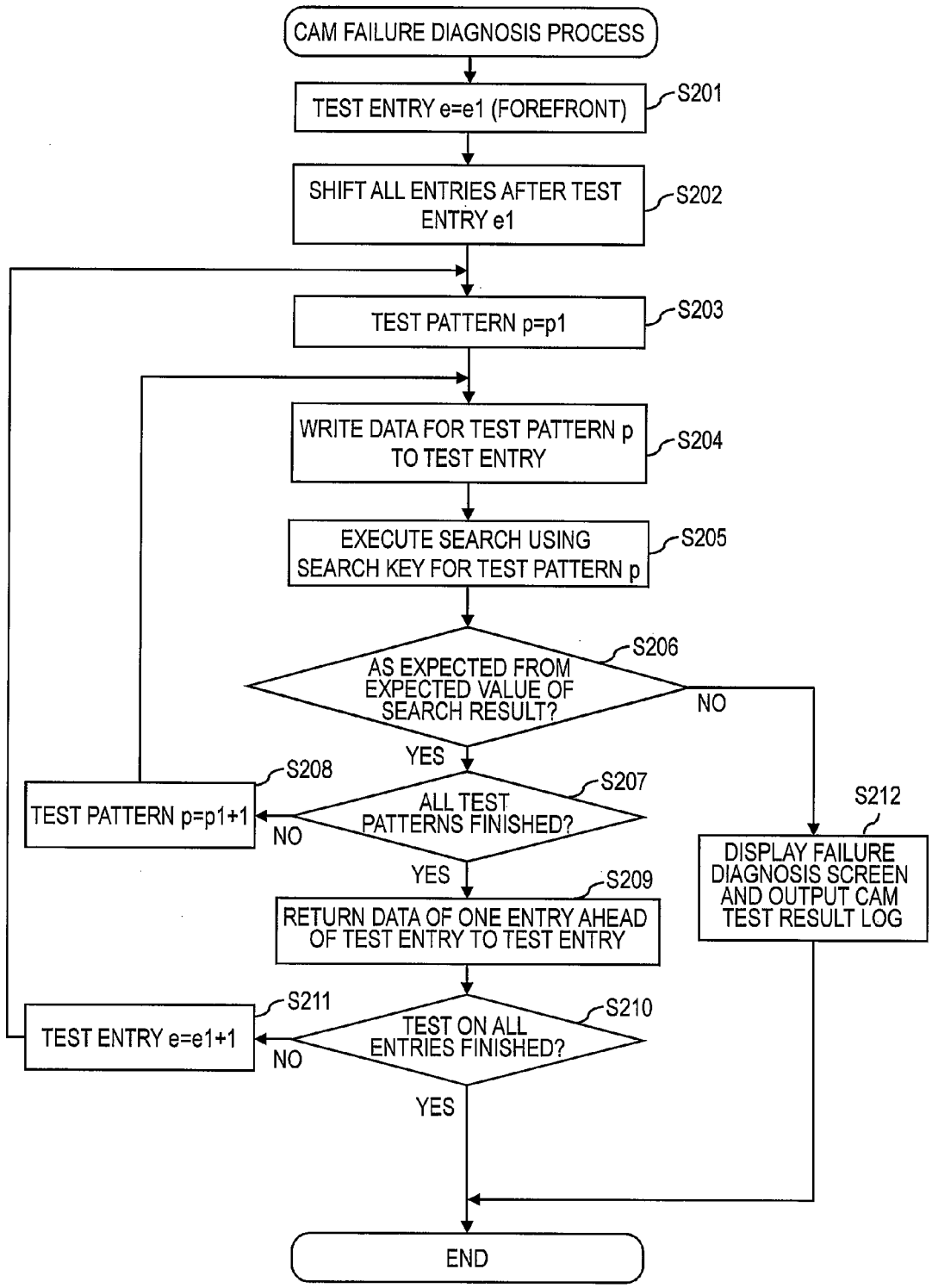
FIG. 7 is a flowchart of a CAM failure diagnosis process according to embodiment 1.

FIG. 7 is a flowchart of the CAM failure diagnosis process according to embodiment 1.

First, the CAM diagnosis control unit 211 determines an entry (e1 illustrated in FIG. 3) whose entry address is at the forefront as the test object entry (S201).

Next, the CAM diagnosis control unit 211 shifts the data stored at each entry configured after the entry to be a test object so as to empty the entry to be a test object (S202). In S202, the CAM diagnosis control unit 211 increments each entry address registered at the entry address 204 of each record configured after the record in which the entry address of the test object entry is registered at the entry address 204 of the destination information table 25.

Next, the CAM diagnosis control unit 211 determines the pattern ID "P1" of the CAM test pattern 212 as the test object test pattern (S203).

Next, the CAM diagnosis control unit 211 stores the data to be stored during diagnosis of the test object test pattern at the entry to be a test object (S204). Since the data to be stored during diagnosis includes information in which the destination IP address 2021 indicates the entry is for test, when the data to be stored during diagnosis is stored at the entry to be a test object, the entry address 2011 of the entry to be a test object will be changed to "1" so as to indicate the entry is the test object.

Next, the CAM diagnosis control unit 211 outputs a search request to the destination information CAM 24 by using the search key for test of the test object test pattern (S205).

Next, 211 makes a determination as to whether or not the result of the search conducted by the destination information CAM 24 matches the expected value of search result 404 of the test object test pattern (S206). For example, when the test object entry includes "e1" for its entry address and when the test object test patterns includes "P1" for its test pattern ID, the CAM diagnosis control unit 211 makes a determination as to whether or not the search result indicates that an entry matching the search key exists and whether or not the entry includes "e1" for its entry address.

When it is determined in S206 that the search result by the destination information CAM 24 matches the expected value of search result 404 of the test object test pattern, the CAM diagnosis control unit 211 makes a determination as to whether or not a diagnosis on the entry to be a test object has been executed using all the test patterns of the CAM test pattern 212 (S207).

When it is determined in S207 that a diagnosis on the test object entry has not been executed with all the test patterns of the CAM test pattern 212, the CAM diagnosis control unit 211 determines a test pattern identified by a pattern ID which includes the pattern ID of the test pattern to be a test object plus 1 as the new test pattern to be a test object (S208), and returns to S204.

On the other hand when it is determined in S207 that a diagnosis on the test object entry has been executed with all the test patterns of the CAM test pattern 212, the CAM diagnosis control unit 211 shifts the data stored at an entry configured one ahead of the entry to be a test object back to the entry to be a test object so as to return the entry to be a test object to the state prior to being the test object (S209).

Then, the CAM diagnosis control unit 211 makes a determination as to whether or not the diagnoses on all the entries of the destination information CAM 24 have been completed (S210).

When it is determined in S210 that the diagnoses on all the entries of the destination information CAM 24 have been completed, the CAM diagnosis control unit 211 ends the process.

On the other hand, when it is determined in S210 that the diagnoses on all the entries of the destination information CAM 24 have not been completed, the CAM diagnosis control unit 211 determines an entry identified by entry address which includes the the entry address of the entry to be a test object plus 1 as the next entry to be a test object (S211), and returns to S203.

On the other hand, when it is determined in S206 that the search result by the destination information CAM 24 does not match the expected value of search result 404 of the test object test pattern, the CAM diagnosis control unit 211 determines that there is a failure occurring at the comparator and the AND circuit 243 (i.e., search circuit) of the entry to be a test object, displays a failure diagnosis screen notifying a user of the failure, outputs the CAM test result log 213, stores the CAM test result log 213 (S212), and ends the process. The CAM test result log 213 includes the entry address to be a test object at which the failure was detected, the test pattern ID, the data to be stored during diagnosis, the search key, the expected value of search result, and the search result. The details of the CAM test result log 213 will be described with reference to FIG. 8.

FIG. 8 is an explanatory diagram illustrating the CAM test result log 213 according to embodiment 1.

The CAM test result log 213 includes a fault detection entry 501, a pattern ID 502, a data pattern 503, a search key pattern 504, an expected value of search result 505, and a search result 506.

The fault detection entry 501 registers therein an entry address of an entry at which a failure is detected. The pattern ID 502 registers therein a pattern ID of the test object test pattern when a failure is detected. The data pattern 503 registers therein the data to be stored during diagnosis of the test object test pattern when the failure is detected. The search key pattern 504 registers therein the search key for test of the test object test pattern when the failure is detected.

The expected value of search result 505 registers therein the expected value of search result of the test object test pattern when the failure is detected. The expected value of search result 505 includes a hit/no-hit 507 and a hit entry address 508. The hit/no-hit 507 registers therein the same content as the hit/no hit 405 of the test object test pattern. The hit entry address 508 registers therein the same content as the hit entry address 406 of the test object test pattern.

The search result 506 registers therein a search result of a search conducted by the destination information CAM 24 when a failure is detected. The search result 506 includes a hit/no-hit 509 and a hit entry address 510. The hit/no-hit 509 registers therein information which indicates whether or not an entry matching the search key included in the search result by the destination information CAM 24 exists. The hit entry address 510 registers therein an entry address of the entry matching the search key included in the search result by the destination information CAM 24.

When it is determined in S206 of FIG. 7 that the search result by the destination information CAM 24 does not match the expected value of search result of the test object test pattern, the CAM test result log 213 includes only one entry in order for the CAM test result log 213 to be outputted and the process to end.

A user will be able to grasp which entry of the destination information CAM 24 functions abnormally as reflected in the test pattern by virtue of the CAM test result log 213.

Next, a modification of embodiment 1 will be described with reference to FIG. 9 and FIG. 10.

According to embodiment 1, when it is determined in S206 that a result of a search conducted by the destination information CAM 24 does not match the expected value of search result, the process immediately proceeds to S212 and ends the process as illustrated in FIG. 7.

According to the present modification, even when it is determined in S206 that a result of a search conducted by the destination information CAM 24 does not match the expected value of search result, the process continues by executing the diagnosis process using all the test patterns to all entries.

Figure 9:
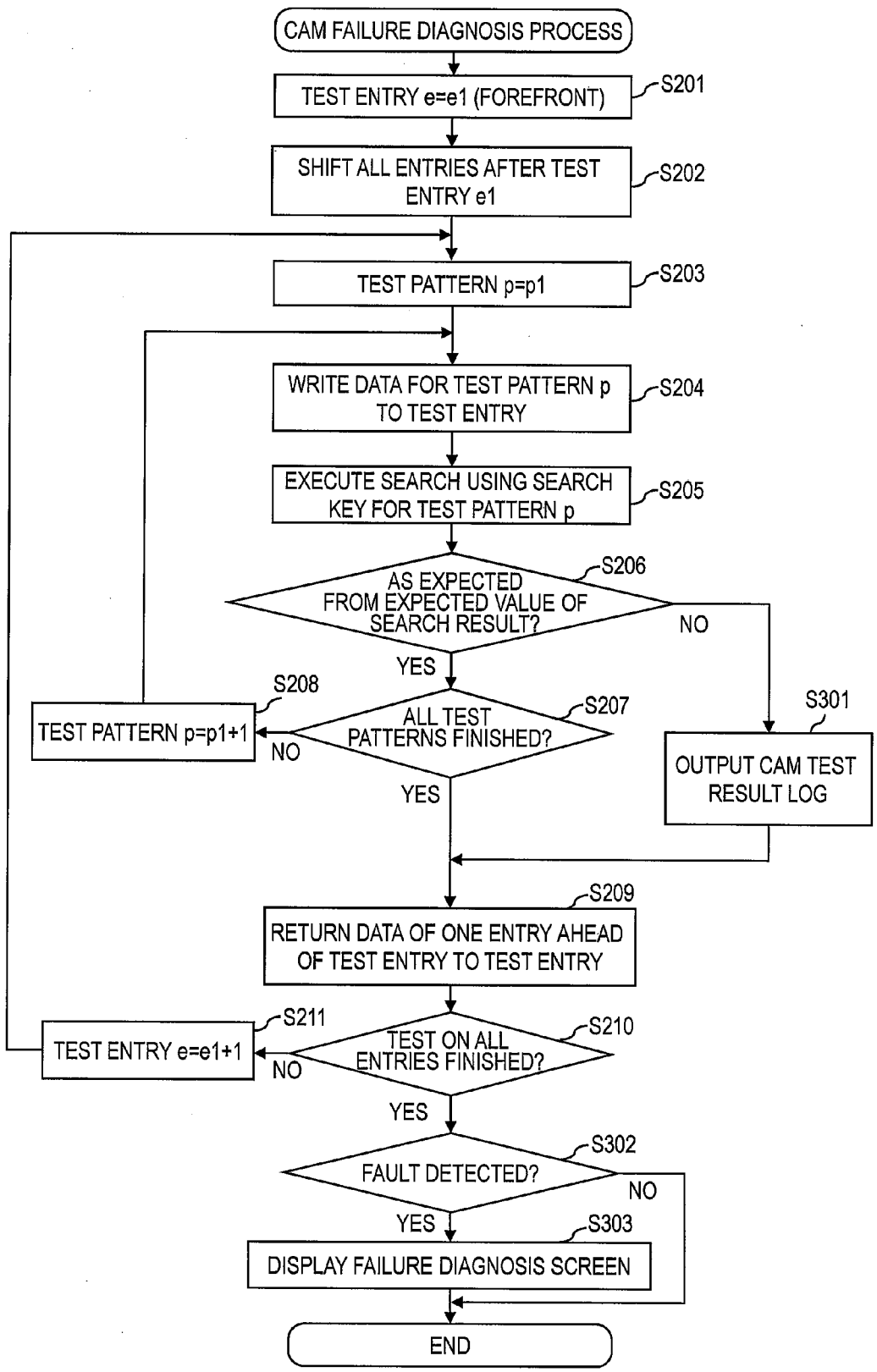
FIG. 9 is a flowchart of the CAM failure diagnosis process according to a first modification of embodiment 1.

FIG. 9 is a flowchart of the CAM failure diagnosis process according to a first modification of embodiment 1. [Note the processes in FIG. 9 that are illustrated in FIG. 7 will be assigned with the same reference numerals as those in FIG. 7 and the description thereof will be omitted.

When it is determined in S206 that a result of a search conducted by the destination information CAM 24 does not match the expected value of search result 404, the CAM diagnosis control unit 211 determines that there is a failure occurring at the comparator and the AND circuit 243 of the entry to be a test object, outputs the CAM test result log 213, stores the CAM test result log 213 (S301), and proceeds to S209.

When it is determined in S210 that the diagnoses on all the entries of the destination information CAM 24 have been completed, the CAM diagnosis control unit 211 refers to the CAM test result log 213 in order to make a determination as to whether or not a failure is detected at any one of the entries of the destination information CAM 24 (S302).

When it is determined in S302 that a failure is detected at an entry of the destination information CAM 24, the CAM diagnosis control unit 211 displays the failure diagnosis screen (S303), and ends the process.

When it is determined in S302 that a failure is not detected at any entry of the destination information CAM 24, the CAM diagnosis control unit 211 ends the process.

By this, even when it is determined in S206 that a result of a search conducted by the destination information CAM 24 does not match the expected value of search result 404, the CAM diagnosis control unit 211 repeats the process, instead of ending the process, until the diagnosis process using all the test patterns are executed to all the entries of the destination information CAM 24.

FIG. 10 is an explanatory diagram illustrating the CAM test result log 213 according to the first modification of embodiment 1. Note the elements in FIG. 10 that are illustrated in FIG. 8 will be assigned with the same reference numerals as those in FIG. 8 and the description thereof will be omitted.

According to the present modification, when it is determined in S206 that a result of a search conducted by the destination information CAM 24 does not match the expected value of search result 404, the process proceeds to S212, the CAM test result log 213 is outputted and stored. Accordingly, after the CAM failure diagnosis process is completed, the CAM test result log 213 may include multiple entries as illustrated in FIG. 10.

By virtue of the configuration as described above, since the failure diagnosis process according to the present modification will be executed using all the test patterns to all the entries of the destination information CAM 24, a user will be operable to grasp all the entries, test patterns, and search results in which a failure is detected at the destination information CAM 24.

According to the present embodiment, the CAM diagnosis control unit 211 is operable to grasp the expected value of search result which includes the matching entry address corresponding to the search key for test. Accordingly, even when there are multiple entries that match the search key for test, unless the search result matches the expected value of search result, the CAM diagnosis control unit 211 is operable to grasp that a failure is occurring at an entry to be a test object.

Further, according to the present embodiment, since the data stored at the entries configured after the entry to be a test object will be shifted, it becomes possible to execute the frame transfer process in a normal manner even during the CAM failure diagnosis process is executed.

Further, the destination information CAM 24 does not refer to the entries whose test entry indication bits 2021 indicate that they are going to be test object during the frame transfer process. Accordingly, it becomes possible to prevent erroneous transfers of frames wherein an entry address of an entry of an entry to be a test object already having stored therein the data to be stored during diagnosis is returned to the CAM test result log 213.

Hereinafter, a second modification of embodiment 1 will be described with reference to FIG. 11. According to the present embodiment the data to be stored during diagnosis will not be stored at a test object entry of the destination information CAM 24. Instead, at least one search key for test and an expected value of search result will be generated based on the data stored at the test object entry, and the CAM failure diagnosis process will be executed by using the generated search key for test and the expected value of search result. Accordingly, the process load on the destination information CAM 24 will be reduced since the data shift for the entries configured after the entry to be a test object and the data shift from the entry to be a test object to the CAM entry save memory 27 will not be necessary. Further, an administrator of the present system will be able to reduce his/her workload since presetting of the CAM test pattern 212 will not be necessary.

FIG. 11 is an explanatory diagram illustrating a summary of the CAM failure diagnosis process according to the second modification of embodiment 1.

The CAM diagnosis control unit 211 determines an entry which will be an object of the test conducted by the destination information CAM 24, and changes the destination IP address 2021 of the entry determined to be a test object to "1" so that the destination IP address 2021 of the entry to be a test object indicates that the entry is the test object. Note that the destination IP address 2021 of the entries other than the test object entry will store therein "0."

Then, the CAM diagnosis control unit 211 generates a search key for test and an expected value of search result for test based on the data stored at the entry to be a test object, and executes the CAM failure diagnosis process using the generated search key for test and the expected value of search result for test. It is to be noted that, unlike embodiments 1 through 3, the data to be stored during diagnosis will not be stored at the entry to be a test object.

The CAM diagnosis control unit 211 determines that a failure has occurred when the destination information CAM 24 includes an invalid entry and when the entry matching the generated search key is the invalid entry.

For example, a generation method of a search key when the test object entry includes "101X01X" as illustrated in FIG. 11. Note that the "X" bits indicate "Don't Care," which generates a hit whether the search key is "0" or "1."

First, the CAM diagnosis control unit 211 generates a search key ("1010010") 1601 for test by turning each "X" bit of the entry to be a test object into "0" while setting other bits as the same value as they are in the test object entry. When this search key 1601 for test is used to search the destination information CAM 24 the test object entry will generate a hit. Accordingly, the expected value of search result includes an entry matching the search result and the search key 1601, while the entry address will include the entry address of the test object.

Secondly, the CAM diagnosis control unit 211 generates a search key ("1011011") 1602 for test by turning each "X" bit of the entry to be a test object into "1" while setting other bits as the same value as they are in the test object entry. When this search key 1602 for test is used to search the destination information CAM 24 the test object entry will generate a hit. Accordingly, the expected value of search result includes an entry matching the search result and the search key 1602, while the entry address will include the entry address of the test object.

Thirdly, the CAM diagnosis control unit 211 generates search keys 1603 through 1606 for test by turning each "X" bit of the test object entry into "0" and inverting, for each search key, one of the bits of the test object entry having a value other than "X" (i.e., "0" or "1"). Note in this example a search key for test in which the destination IP address 2021 is inverted will not be generated.

For example, since the entry to be a test object includes "101X01X," meaning bits other than the destination IP address 2021 and "X" include "0," "1," "0," and "1," the search keys 1603 through 1606 for test in which those four bits are reversed will be generated. To be more specific, the search key "1110010" 1603 for test includes the first "0" inverted; the search key "1110010" 1604 for test includes the first "1" inverted; the search key "1110010" 1605 for test includes the second "0" inverted; and the search key "1110010" 1606 for test includes the second "1" inverted.

These search keys 1603 through 1606 for test each include "1" for the destination IP address 2021 and one of the values of bits differently from one another inverted from those of the test object entry. Accordingly, none of these search keys for test match any of the entries of the destination information CAM 24, and the expected values of search result of these search keys indicate no entry matching the search key for test exists.

The CAM diagnosis control unit 211 executes the above stated CAM failure diagnosis process to all the entries of the destination information CAM 24 expect for the invalid entries.

Further, when the destination information CAM 24 searches for an entry matching a search key via the frame transfer process, the destination IP address 2021 of all the entries (test object entry and entries other than test object entries) are uniformly set as "Don't Care" by the global mask feature of the destination information CAM 24. By this, since the destination IP address 2021 is set as "Don't Care" in the frame transfer process, when the destination address of the frame that has been received is stored at the entry to be a test object, the entry address to be the test object will be acquired. By this, the frame transfer process can be executed even during the CAM failure diagnosis process.

Next, here is a flowchart of the CAM failure diagnosis process according to the present modification. Note that the CAM failure diagnosis process according embodiment 1 will be described based on FIG. 7 of embodiment 1 and the difference between the CAM failure diagnosis process according to the present modification and the CAM failure diagnosis process according to embodiment 1 will be described in detail.

After determining an entry to be a test object in S201, the CAM diagnosis control unit 211, instead of proceeding to S202, sets information ("1") at the destination IP address 2021 of the entry to be a test object so as to indicate the entry is for test.

Next, the CAM diagnosis control unit 211 generates a search key for test and an expected value of search result for test based on the data stored at the entry to be a test object, and proceeds to S203. A pattern ID is given to the generated search key for test and the expected value of search result for test.

In S203 the CAM diagnosis control unit 211 determines, out of the generated search the key for test and the expected value of search result for test, a pattern ID "P1" as the test object test pattern, and proceeds to S205 instead of executing S204.

While the data to be stored during diagnosis of the test object test pattern is stored at the test object entry in S204 according to embodiment 1, according to the present embodiment the process proceeds to S205 to execute S205 through S207 instead of executing S204.

When it is determined in S207 that the CAM failure diagnosis process has been executed to the entry to be test object entry with all the test patterns, the CAM diagnosis control unit 211, instead of proceeding to S209, sets "0" for the destination IP address 2021 of the entry to be a test object (S503) and proceeds to S210.

Further, although according to the present modification when it is determined in S206 that the result of the search by the destination information CAM 24 does not match the expected value of search result of the test object test pattern the process proceeds to S212 even if the diagnosis process has not been executed to all the entries and ends the process, the present modification may be configured in the same manner as the modification of embodiment 1 such that the process continues until the diagnosis process using all the test patterns are executed to all the entries even when it is determined in S206 that the result of the search by the destination information CAM 24 does not match the expected value of search result of the test object test pattern.

By virtue of the configuration as described above, because the search key for test and the expected value of search result for test are generated based on the data stored at the entry to be a test object, an administrator of the present system will not be required to generate a test pattern in advance and therefore it becomes possible to reduce his/her workload. Further, since frame transfers will not require data shift for the entries configured after the entry to be a test object nor data shift from the entry to be a test object to the CAM entry save memory 27, the process load on the destination information CAM 24 will be reduced.

Further, since the data to be stored during diagnosis will not be stored at the entry to be a test object and the frame transfer process will not require a determination as to whether or not the destination IP address 2021 matches a bit corresponding to the destination IP address 2021 of the search key, even during the CAM failure diagnosis process the frame transfer process can be executed.

A third modification of embodiment 1 will be described with reference to FIG. 12. According to the present embodiment it becomes possible to execute both the frame transfer process and the CAM failure diagnosis process by mediating the execution timing for both of the processes when a process request for a frame transfer process and a process request for a CAM failure diagnosis process are inputted at the same time.

FIG. 12 is and explanatory diagram illustrating a mediation between the frame transfer process and the CAM failure diagnosis process according to the third modification of embodiment 1.

Note that this process of the mediation may be executed by the CAM diagnosis control unit 211 or by a program configured in the control unit 21 not illustrated in the drawings. When the mediation process is executed by the CAM diagnosis control unit 211 or by a program configured in the control unit 21, the destination search unit 23 outputs a process request to the control unit 21 via the control unit interface 233 as the header information inputted from the header information extraction unit 22 is treated as a process request related to the frame transfer process.

At time T1, a process request for a frame transfer process of a frame FR1 is inputted to the control unit 21. At time T2, a process request for a frame transfer process of a frame FR2 is inputted to the control unit 21, and the frame transfer process of the frame FR1 is executed.

At time T4, a process request for a CAM failure diagnosis process and a process request for a frame transfer process of a frame FR4 are inputted to the control unit 21 at the same time. When a process request for a CAM failure diagnosis process and a process request for a frame transfer process of a frame are inputted to the control unit 21 at the same time, the control unit 21 prioritizes the CAM failure diagnosis process and executes the CAM failure diagnosis process at time T5, and executes the frame transfer process of the frame FR4 at time T6.

It is to be noted that although FIG. 12 illustrates an event where the CAM failure diagnosis process is prioritized and executed over the frame transfer process, the frame transfer process may be prioritized and executed instead the CAM failure diagnosis process.

As described above, when a process request for a CAM failure diagnosis process and a process request for a frame transfer process are received at the same time, each process will be executed by mediating the execution timings of the CAM failure diagnosis process and the frame transfer process. By this, it becomes possible to prevent an event where a process request for a CAM failure diagnosis process and a process request for a frame transfer process are received at the same time and one of the process requests is subsequently discarded and either one of the processes remains unexecuted.

Embodiment 2

Hereinafter, embodiment 2 of the present invention will be described with reference to FIG. 13 through FIG. 15.

In embodiment 1 in order to empty an entry to be a test object to the destination information CAM 24, the data stored at each entry configured after the entry to be a test object needed to be shifted to entries respectively configured one ahead thereof. According to the network apparatus 10 of the present embodiment, however, such shifting of the data stored at the entries configured after the entry to be a test object will not be necessary as will be described below.

The configuration of the network apparatus 10 according to the present embodiment requires the CAM entry save memory 27. According to the present embodiment, the CAM diagnosis control unit 211 outputs to the CAM diagnosis process unit 234 an instruction to shift the data stored at the entry to be a test object of the destination information CAM 24 to the CAM entry save memory 27. When such instruction is inputted, the CAM diagnosis process unit 234 shifts the data stored at the entry to be a test object of the destination information CAM 24 to the CAM entry save memory 27 so as to empty the entry to be a test object entry. By this, the destination address originally stored at the entry to be a test object is shifted to the CAM entry save memory 27. Accordingly, by referring to the destination information CAM 24 and the CAM entry save memory 27 via the frame transfer process and by acquiring an entry address matching the received destination address, the network apparatus 10 is operable to transfer received frames without shifting the data stored at the entries respectively configured one ahead of the entry to be a test object.

Figure 13:
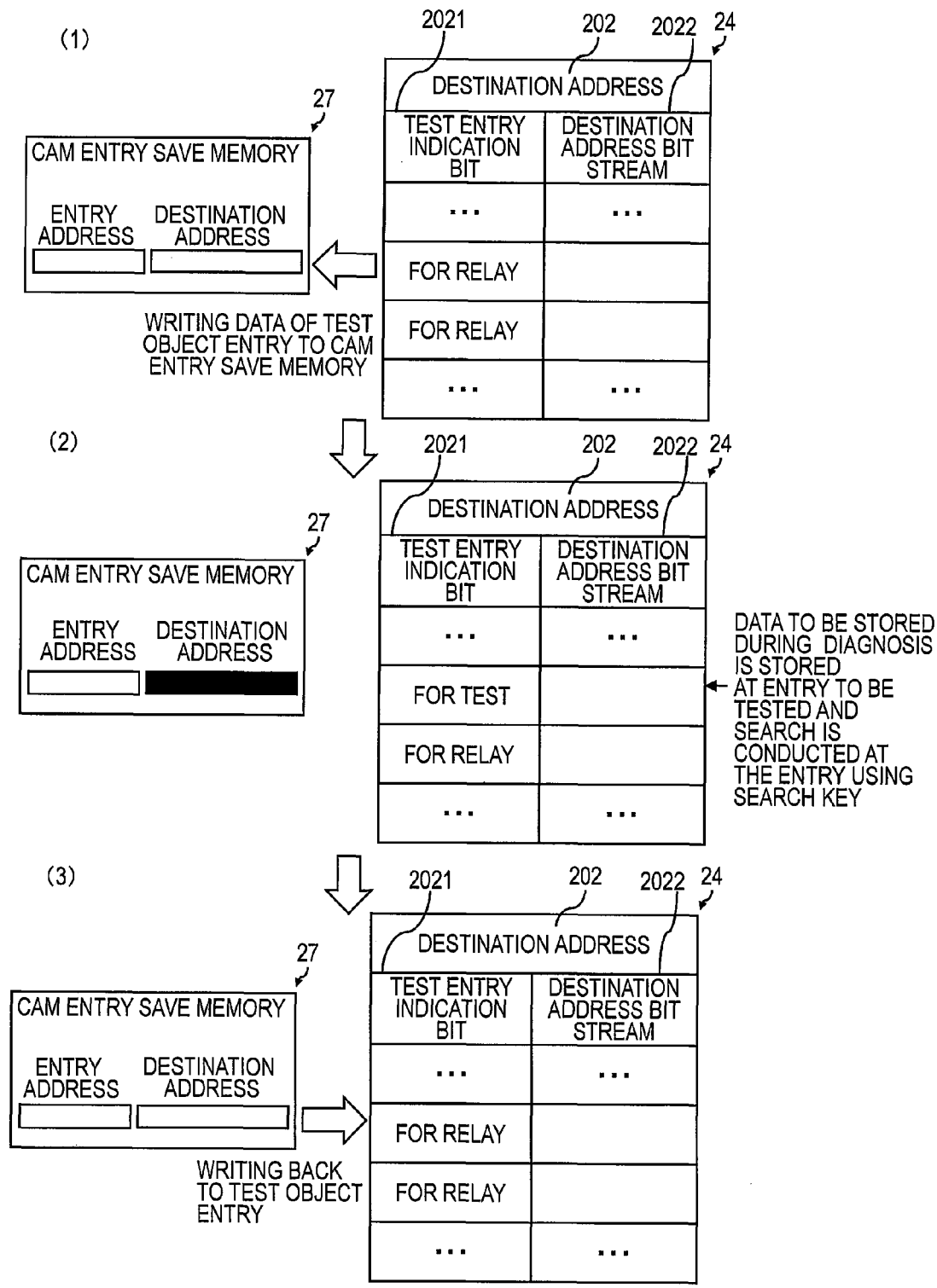
FIG. 13 is an explanatory diagram illustrating a summary of the CAM failure diagnosis process according to embodiment 2.

FIG. 13 is an explanatory diagram illustrating a summary of the CAM failure diagnosis process according to embodiment 2.

In (1) after determining an entry to be the test object of the destination information CAM 24 and before storing the data to be stored during diagnosis at the entry to be a test object, the CAM diagnosis control unit 211 shifts the destination address 202 stored at the entry to be a test object to the CAM entry save memory 27. Since the data to be stored during diagnosis is not stored at the entry to be a test object in (1), the destination IP address 2021 of the test object remains "for relay."

In (2) the CAM diagnosis control unit 211 causes the entry to be a test object to store the data to be stored during diagnosis of the test object test pattern at the CAM diagnosis process unit 234, and causes the CAM diagnosis process unit 234 to search the destination information CAM 24 using the search key of the test object test pattern.

In (3) when the search result is inputted, the CAM diagnosis control unit 211 stores the destination address of the entry to be a test object saved at the CAM entry save memory 27 back at the entry which was a test object so as to bring said entry to the state it was before it become the test object.

The processes (1) through (3) are executed to all the entries of the destination information CAM 24.

As described above, since the destination IP address 202 stored at the entry to be a test object will be stored at the CAM entry save memory 27 before the data to be stored during diagnosis is stored at the entry to be a test object, the network apparatus 10 is operable to transfer received frames by referring to the destination information CAM 24 and 27 without shifting the destination address 202 stored at the entries configured after the entry to be a test object to the entries configured one ahead.

Figure 14:
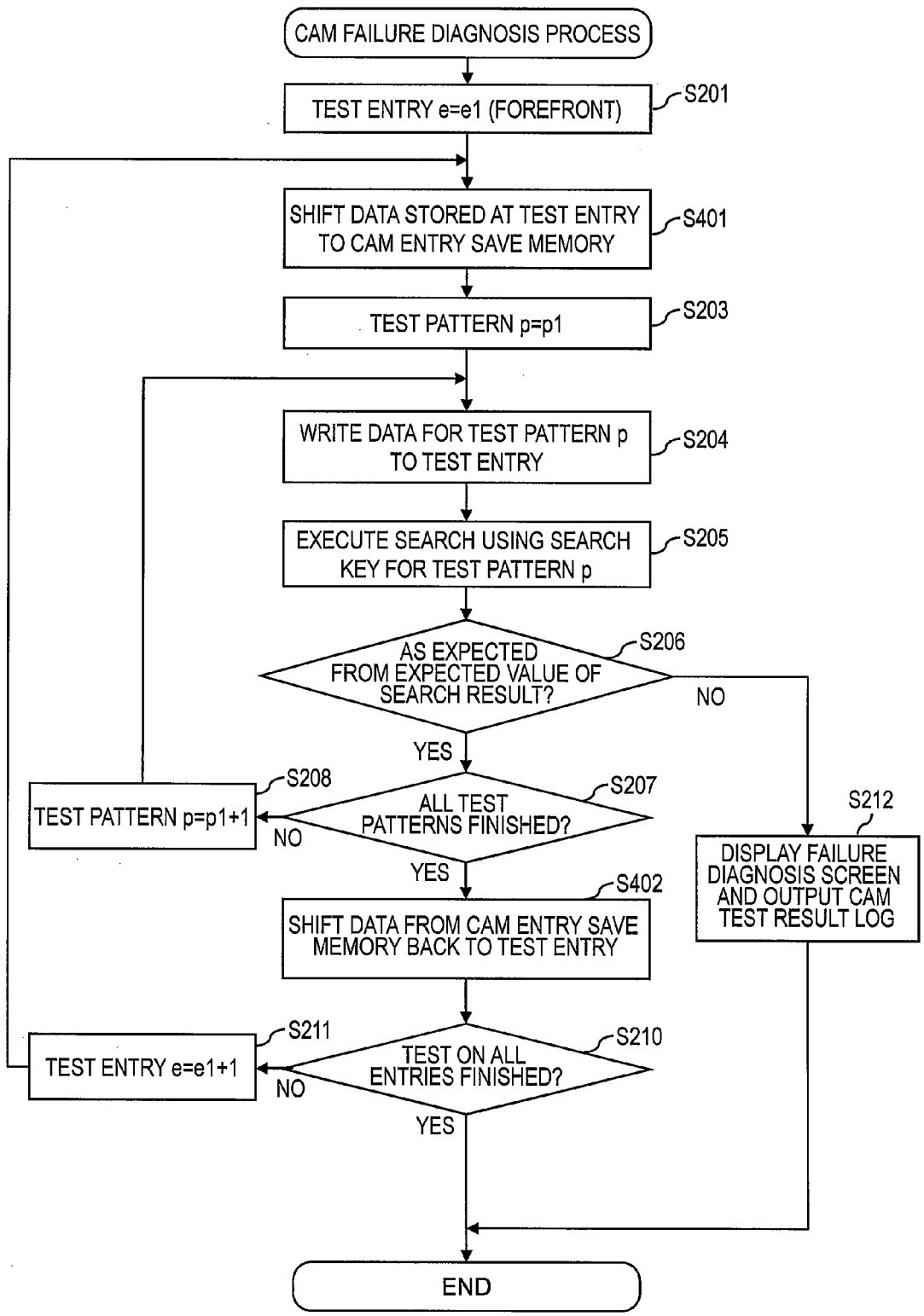
FIG. 14 is a flowchart of the CAM failure diagnosis process according to embodiment 2.
Figure 15:
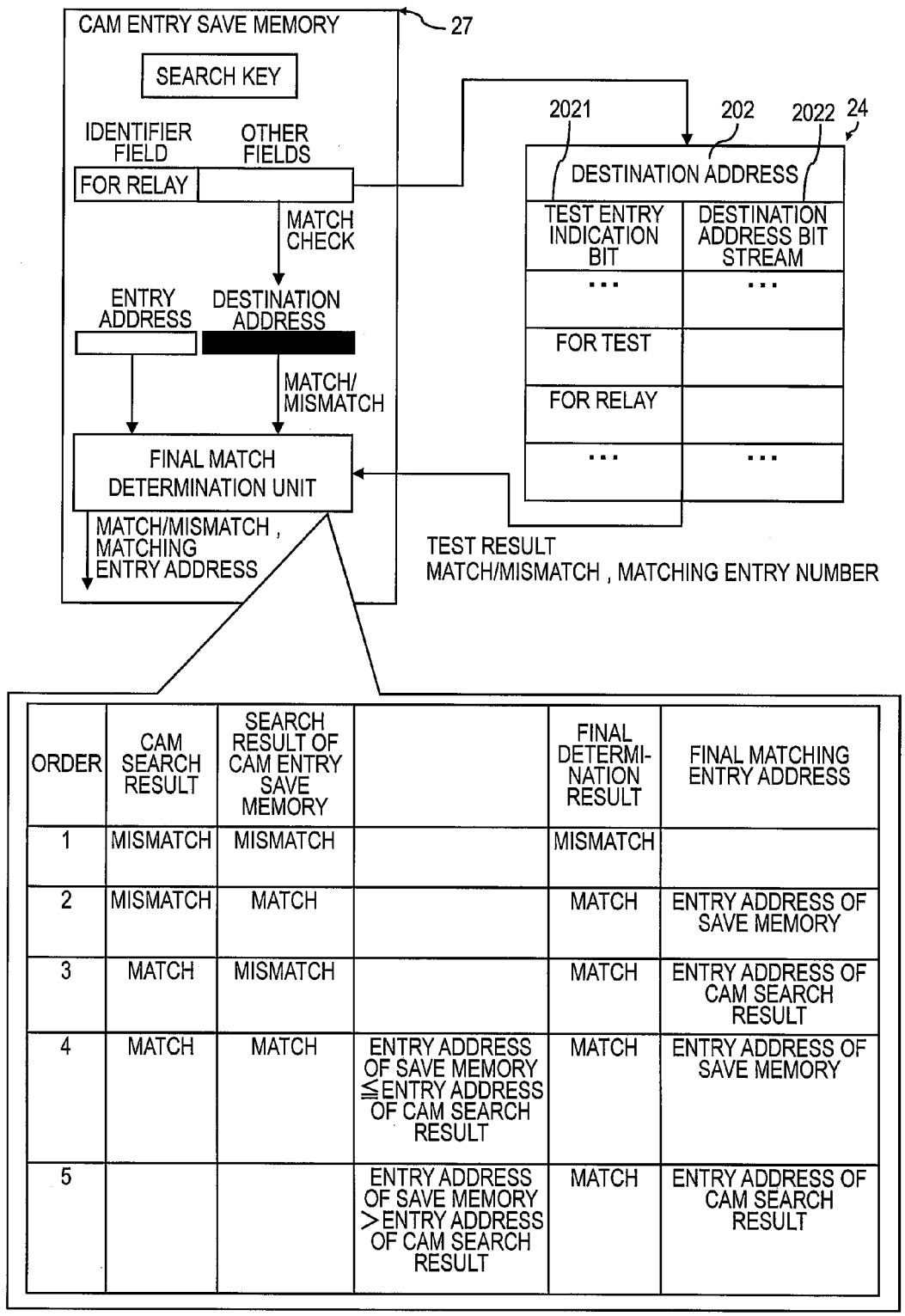
FIG. 15 is an explanatory diagram illustrating the frame transfer process according to embodiment 2.

FIG. 14 is a flowchart of the CAM failure diagnosis process according to embodiment 2. Note the processes in FIG. 14 that are identical to the processes illustrated in FIG. 7 of embodiment 1 will be assigned with the same reference numerals as those in FIG. 7 and the description thereof will be omitted.

The CAM diagnosis control unit 211 shifts the data stored at an entry determined in S201 or S211 to be a test object of the destination information CAM 24 to the CAM entry save memory 27, erases the data stored at the entry to be a test object (S401), proceeds to S203, and diagnoses as to whether or not a failure is occurring at the entry to be a test object. By the process of S401, the entry to be a test object will have nothing stored therein.

When it is determined in S207 that the diagnosis on the entry to be a test object using all test patterns of the CAM test pattern 212 has been executed, the diagnosis on the entry to be a test object is completed. Accordingly, the CAM diagnosis control unit 211 shifts the data which had been shifted to the CAM entry save memory 27 back to the entry to be a test object (S402), and proceeds to S201. By this, after the execution of the diagnosis process the entry to be a test object will return to the status it was prior to the diagnosis process and be stored with the destination address.

Further, although according to the present embodiment when it is determined in S206 that the result of the search by the destination information CAM 24 does not match the expected value of search result of the test object test pattern the process proceeds to S212 even if the diagnosis process has not been executed to all the entries and ends the process, the present embodiment may be configured in the same manner as the modification of embodiment 1 such that the process continues until the diagnosis process using all the test patterns are executed to all the entries even when it is determined in S206 that the result of the search by the destination information CAM 24 does not match the expected value of search result of the test object test pattern.

Next, the frame transfer process when the destination address stored at the entry to be a test object of the destination information CAM 24 has been shifted to the CAM entry save memory 27 will be described with reference to FIG. 15. FIG. 15 is an explanatory diagram illustrating a frame transfer process according to embodiment 2.

When the network apparatus 10 receives a frame while the destination address 202 of the entry to be a test object of the destination information CAM 24 is stored at the CAM entry save memory 27 and the data to be stored during diagnosis is stored at the entry to be the test object of the destination information CAM 24, the network apparatus 10 executes the frame transfer process. This is because the frame transfer process can be executed even during the CAM failure diagnosis process.

When the frame transfer process is executed while the CAM failure diagnosis process is being executed, when a search request is inputted from the header information extraction unit 22, the CAM search process unit 231 outputs the search key (the destination address of the received frame) included in the inputted search request to the destination information CAM 24 and the CAM diagnosis process unit 234.

The CAM diagnosis process unit 234 searches for data matching the search key at the CAM entry save memory 27, and outputs the search result to the CAM search process unit 231.

Further, the destination information CAM 24 searches for an entry matching the search key, and outputs the search result to the CAM search process unit 231.

The CAM search process unit 231 includes a final match determination unit arranged to determine either one of the search result of the CAM entry save memory 27 and the search result of the destination information CAM 24 to be a final search result.

The final match determination unit outputs the final search result to the destination information table search unit 232 in accordance with a predetermined policy and based on the search result of the CAM entry save memory 27 and the search result of the destination information CAM 24.

Hereinafter, the policy used by the final match determination unit will be described.

When the search result of the destination information CAM 24 indicates no match and the search result of the CAM entry save memory 27 indicates no match, the final match determination unit determines that the final search result is no match.

When the search result of the destination information CAM 24 indicates no match and the search result of the CAM entry save memory 27 indicates a match, the final match determination unit determines the search result of the CAM entry save memory 27 to be the final search result. Accordingly, the final search result indicates a match, and includes the entry address included in the search result of the CAM entry save memory 27 as the matching entry address.

When the search result of the destination information CAM 24 indicates a match and the search result of the CAM entry save memory 27 indicates no match, the final match determination unit determines the search result of the destination information CAM 24 to be the final search result. Accordingly, the final search result indicates a match, and includes the entry address included in the search result of the destination information CAM 24 as the matching entry address.

When the search result of the destination information CAM 24 indicates a match and the search result of the CAM entry save memory 27 indicates a match, the final match determination unit makes a determination as to whether or not the matching entry address of the search result of the CAM entry save memory 27 is below the matching entry address of the search result of the destination information CAM 24. When it is determined that the matching entry address of the search result of the CAM entry save memory 27 is below the matching entry address of the search result of the destination information CAM 24, the final match determination unit determines the search result of the CAM entry save memory 27 to be the final search result. Accordingly, the final search result indicates a match, and includes the entry address included in the search result of the CAM entry save memory 27 as the matching entry address. On the other hand, when it is determined that the matching entry address of the search result of the CAM entry save memory 27 is greater the matching entry address of the search result of the destination information CAM 24, the final match determination unit determines the search result of the destination information CAM 24 to be the final search result. Accordingly, the final search result indicates a match, and includes the entry address included in the search result of the destination information CAM 24 as the matching entry address. Note that the search result having a smaller matching entry address is determined to be the final search result because the priority encoder circuit 242 (see FIG. 3) of the destination information CAM 24 is configured to determine a smaller entry address as the final search result, however, the present invention is not limited to such configuration.

By virtue of the configuration as described above, according to the present embodiment, since the data stored at the entry to be a test object is shifted to the CAM entry save memory 27 and the data to be stored during diagnosis is stored at the entry to be a test object, there will be no need to shift the data stored at entries configured after the entry to be a test object. Accordingly, the process load of the destination information CAM 24 will be reduced.

Embodiment 3

Hereinafter, embodiment 3 of the present invention will be described with reference to FIG. 16 and FIG. 17. The destination information CAM 24 according to the present embodiment includes the CAM entry save memory 27 and the CAM diagnosis process unit 234, and is operable to execute the CAM failure diagnosis process according to the present invention by simply implementing the destination information CAM 24 to an existing network apparatus.

Figure 16:
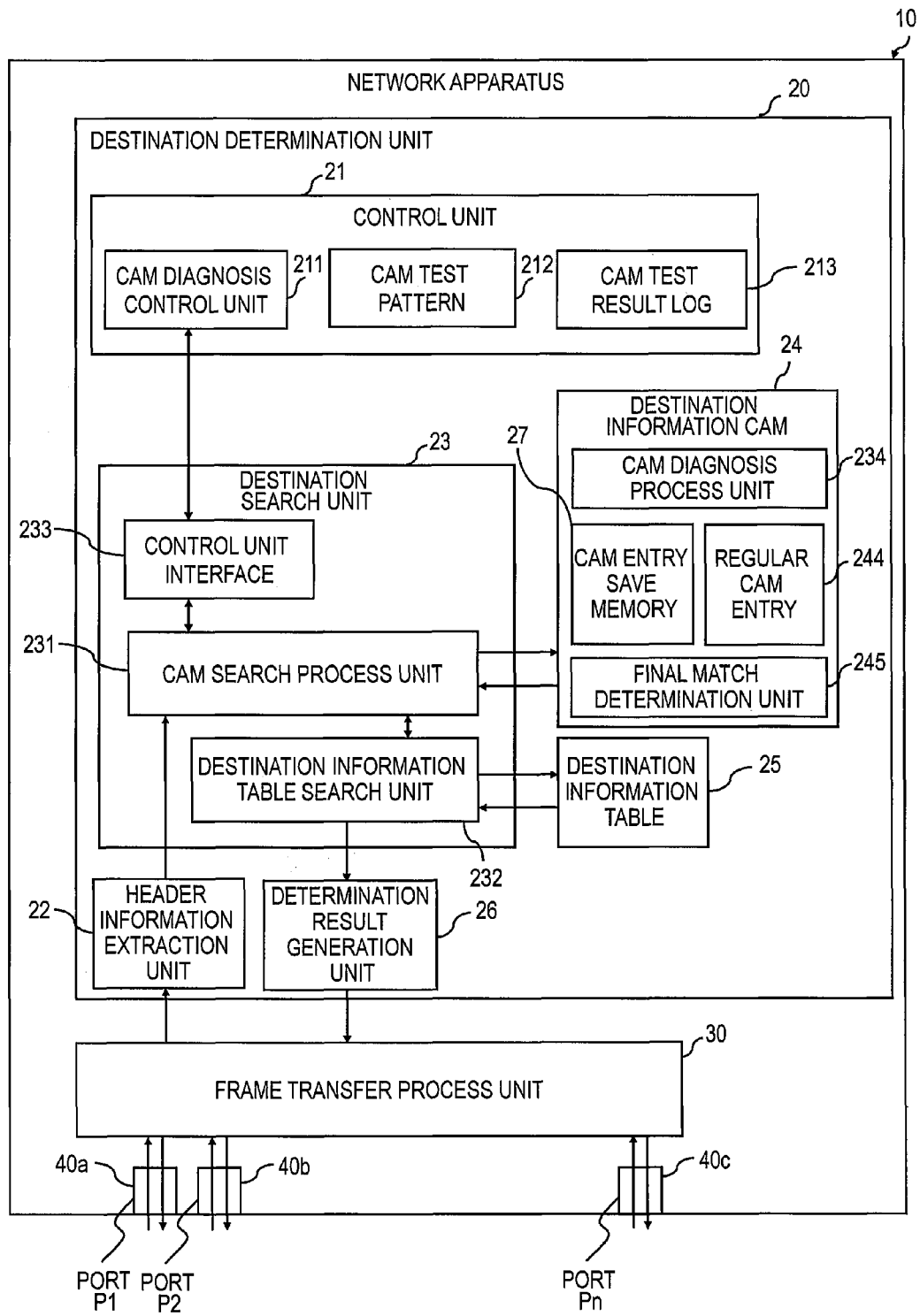
FIG. 16 is an explanatory diagram illustrating the network apparatus according to embodiment 3.
Figure 17:
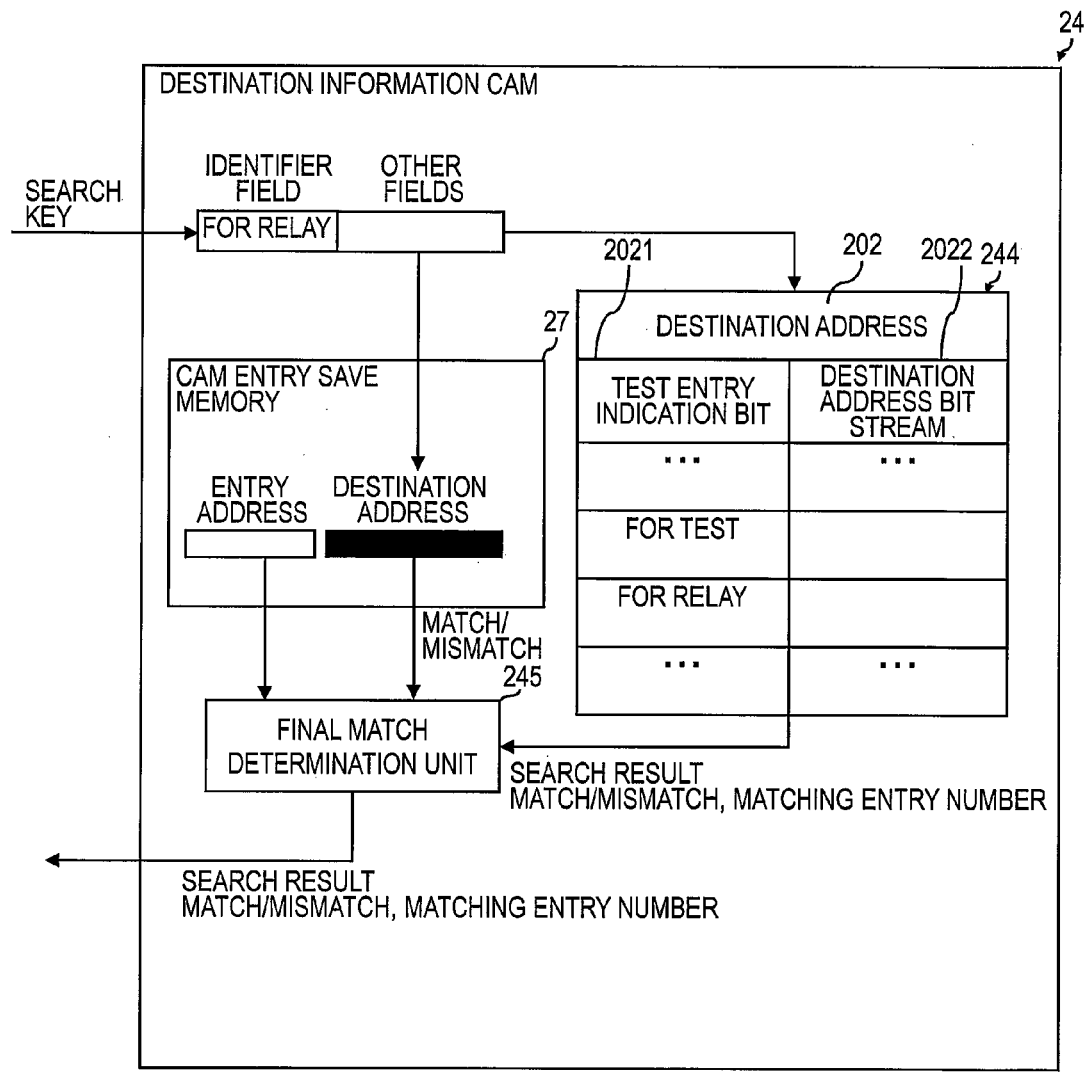
FIG. 17 is an explanatory diagram illustrating the frame transfer process according to embodiment 3.

FIG. 16 is an explanatory diagram illustrating the network apparatus 10 according to embodiment 3. Note the elements in FIG. 16 that are illustrated in FIG. 1 of embodiment 1 will be assigned with the same reference numerals as those in FIG. 1 and the description thereof will be omitted.

The destination information CAM 24 includes the CAM diagnosis process unit 234, the CAM entry save memory 27, a regular CAM entry 244, and a final match determination unit 245.

The regular CAM entry 244 is an entry registers therein a destination address of the destination information CAM 24. The final match determination unit 245 executes the same process as those executed by the final match determination unit as described in embodiment 2.

The description of the CAM failure diagnosis process will be omitted since the CAM failure diagnosis process according to the present embodiment is the same as the CAM failure diagnosis process according to embodiment 2 except that the CAM entry save memory 27 is configured within the destination information CAM 24.

Hereinafter a frame transfer process according to the present embodiment will be described with reference to FIG. 17. FIG. 17 is an explanatory diagram illustrating the frame transfer process according to embodiment 3.

When a search request is inputted from the header information extraction unit 22, the CAM search process unit 231 outputs the search key (the destination address of the received frame) included in the inputted search request to the destination information CAM 24 and the CAM diagnosis process unit 234.

When the search key is inputted, the destination information CAM 24 searches for data matching the search key at the CAM entry save memory 27 and outputs the search result to the final match determination unit 245.

Further, the destination information CAM 24 searches for an entry matching the search key at the regular CAM entry 244, and outputs the search result to the final match determination unit 245.

The final match determination unit 245 determines either one of the search result of the CAM entry save memory 27 and the search result of the regular CAM entry 244 to be the final search result, and outputs the determined final result to the CAM search process unit 231. The policy used by the final match determination unit 245 to determine the final search result is the same as that described with reference to FIG. 14, and thus its description will be omitted.

By virtue of the configuration as described above, since the destination information CAM 24 includes the CAM diagnosis process unit 234, the CAM entry save memory 27, and the final match determination unit 245, it becomes possible to execute the CAM failure diagnosis process according to the present invention by simply implementing the destination information CAM 24 to an existing network apparatus.

It is to be noted that although destination search is described as the use of a CAM according to the present embodiment, the use of a CAM is not limited to destination search and is applicable in various purposes. For example, a CAM may store therein combinations of information of multiple fields included in the header of a frame, while the destination search unit 23 executes a filer search process to determine whether or not to discard or pass a received pass. Further, a CAM may store therein at least a portion of information of a header of a frame, while the destination search unit 23 executes a priority search process to determine the priority of a received frame.

Hereinafter, the details of the filter search process will be described. Each entry of the destination information CAM 24 registers therein combinations of the information of multiple fields included in the header of a frame, while the destination information table 25 registers therein, instead of output information, filter information for determining whether to discard or pass the frame. At this point, when a determination result including the entry address of the destination information CAM 24 is inputted from the destination information table search unit 232, the destination information table search unit 232 refers to the destination information table 25 so as to acquire the filter information corresponding to the entry address included in the determination result, makes a determination on whether to discard or pass the received frame, and outputs the determination result including the determination on whether to discard or pass the frame to determination result generation unit 26.

Note that in the filter search process each entry of the destination information CAM 24 only needs to register therein the information of at least one field included in the header of a frame.

Hereinafter, the details of the priority search process will be described. Each entry of the destination information CAM 24 registers therein at least a portion of the header of a frame instead of the destination IP address, while the destination information table 25 registers therein process priority information instead of the output information. At this point, when a determination result including the entry address of the destination information CAM 24 is inputted from the destination information table search unit 232, the destination information table search unit 232 refers to the destination information table 25 so as to acquire the process priority information corresponding to the entry address included in the determination result, makes a determination on the priority of the received frame, and outputs the determination result including the priority of the frame to determination result generation unit 26.

As described above, the failure diagnosis process of the present invention is applicable not only to the CAM used for determining a destination but to the CAM used for determining whether to discard or pass a frame and to the CAM used for determining the priority of a frame. In other words, the failure diagnosis process of the present invention is applicable to the CAM used for determining actions related to transferring received frames.

Accordingly, the destination search unit 23 is a unit configured to refer to the CAM and determine actions related to transferring received frames. Therefore, in the claims of this specification, the destination information CAM 24 is referred to as an action determination unit.

Each of the above-mentioned embodiments is a preferred embodiment of this invention, and various modifications and changes may be made without departing from the gist of this invention.

This invention is not limited to the embodiment described above, and includes various modification examples. For instance, the embodiment given above is a detailed description that is written for easy understanding of this invention, and this invention is not necessarily limited to a mode that includes all the components described. Replacing some components of one embodiment with components of another embodiment is also an option. Components of one embodiment may be added with components of another embodiment. For some components in each embodiment, other components may be added or deleted or may substitute.

Some of or all of the components, functions, processing parts, processing measures, and the like described above may be implemented by hardware by, for example, designing those in the form of an integrated circuit. Alternatively, the components, functions, and the like described above may be implemented by software by having a processor interpret and execute programs that respectively implement the described functions. Programs, tables, files, and other types of information for implementing the described functions can be put in a memory, a recording device such as a hard disk or a solid state drive (SSD), or a recording medium such as an IC card, an SD card, or a DVD.

The control lines and information lines given above are ones deemed as necessary to describe this invention, and not all of control lines and information lines of a product are necessarily given above. It may be considered that almost all components are connected to one another in actuality.

What is claimed is:

1. A communication apparatus configured to transmit and receive a frame comprising:
    a contents addressable memory (CAM) configured to retain at least a portion of header information of the frame;
    an action determination unit configured to refer to the CAM and determine an action related to transferring the received frame; and
    a CAM diagnosis unit configured to diagnose a failure at the CAM,
    wherein the CAM includes:
    a plurality of entries each storing therein at least a portion of the header information of the frame, and
    a search circuit for each entry configured to determine whether or not a search key matches data stored at the entry, wherein, in a case of receiving the frame, the action determination unit uses, as a search key, at least a portion of the header information of the frame and determines an action related to transferring the received frame based on identification information of an entry matching at least a portion of the header information of the frame, wherein the CAM diagnosis unit determines an entry to be a test object, wherein the CAM diagnosis unit stores a plurality of test patterns which each include a pattern ID, a data pattern, a search key pattern for a test purpose, and an expected search result, wherein the expected search result has information indicating whether an entry matches the search key for a testing purpose and identification information of an entry matching the search key for a test purpose, wherein the CAM diagnosis unit causes the CAM to search for an entry matching the search key for a test purpose, wherein the CAM diagnosis unit determines whether or not a result of the search matches the expected search result correlated to the search key for a test purpose, and wherein the CAM diagnosis unit diagnoses a failure occurring at the search circuit of an entry to be the test object in a case where it is determined the result of the search does not match the expected search result correlated to the search key for a test purpose.

2. The communication apparatus according to claim 1, wherein the CAM diagnosis unit generates the search keys for a test purpose and the expected search result based on a data pattern stored at an entry to be the test object, and wherein the CAM diagnosis unit causes the CAM to search for an entry matching the search keys for a test purpose.

3. The communication apparatus according to claim 1, further comprising:

a CAM test pattern unit, registering therein the plurality of test patterns to be stored at an entry to be the data pattern, the search keys for a test purpose corresponding to the data pattern, and the expected search result corresponding to the search keys for a test purpose, wherein the CAM diagnosis unit stores the data pattern at an entry to be the test object for a test purpose corresponding to the data pattern.

4. The communication apparatus according to claim 3, wherein the CAM diagnosis unit shifts data stored at the entry and data stored at each entry configured after the entry to empty the entry, and wherein the CAM diagnosis stores the data pattern to the emptied entry.

5. The communication apparatus according to claim 3, further comprising:

a CAM entry save storage area, wherein the CAM diagnosis unit saves data stored at the entry at the CAM save storage area to empty the entry, wherein the CAM diagnosis unit stores the data pattern to the emptied entry.

6. The communication apparatus according to claim 5, wherein the CAM is implemented with the CAM diagnosis unit and the CAM entry save storage area.

7. The communication apparatus according to claim 1, wherein in an event of receiving a transfer process request of the frame and a diagnosis process request of the CAM failure simultaneously, one process will be prioritized and executed and the other process will be executed subsequently.

8. The communication apparatus according to claim 1, wherein data stored at the entry includes test entry identification information configured to indicate whether or not an entry is determined to be the test object, wherein, after determining an entry to be the test object, the CAM diagnosis unit changes the test entry identification information included in data stored at the entry to indicate the entry to be the test object.

9. The communication apparatus according to claim 8, wherein the test entry identification information of the search key for a test purpose is set to indicate the entry to be the test object, and wherein identification information of an entry matching the search key for a test purpose included in the expected search result correlated to the search key for a test purpose includes identification information of the entry to be the test object.

10. The communication apparatus according to claim 9, wherein the CAM diagnosis unit generates the search keys for a test purpose and the expected search result based on a data pattern stored at an entry to be the test object, and wherein the CAM diagnosis unit causes the CAM to search for an entry matching the search keys for a test purpose, and wherein, in a case of referring to the CAM to determine an action related to transferring the received frame, the action determination unit does not refer to the test entry identification information included in data stored at the entry.

11. The communication apparatus according to claim 9, comprising:

a CAM test pattern unit, registering therein the plurality of test patterns to be stored at an entry to be the data pattern, the search keys for a test purpose corresponding to the data pattern, and the expected search result corresponding to the search keys for a test purpose, wherein the test entry identification information of the data pattern is set to indicate the entry is going to be the test object, wherein the CAM diagnosis unit stores the data pattern at the entry to be the test object and changes the test entry identification information included in data stored at the entry to indicate the entry to be the test object, wherein the CAM diagnosis unit causes the CAM to search for an entry matching the search key for a test purpose corresponding to the data pattern, and wherein, in a case of referring to the CAM to determine an action related to transferring the received frame, the action determination unit does not refer to the test entry identification information included in the data pattern stored at the entry.

12. The communication apparatus according to claim 1, wherein the CAM retains a destination included in header information of the frame, and wherein, in a case of receiving the frame, the action determination unit uses as a search key the destination included in header information of the frame and, based on identification information of an entry matching the destination, determines a destination to output the received frame as an action related to transferring the received frame.

13. The communication apparatus according to claim 1,
wherein CAM retains at least one piece of information included in header information of the frame, and
wherein, in a case of receiving the frame, the action determination unit uses as a search key at least one piece of information included in header information of the frame and, based on identification information of an entry matching the at least one piece of information included in header information of the frame, determines either one of determinations to pass and discard the received frame as an action related to transferring the received frame.

14. The communication apparatus according to claim 1,
wherein CAM retains at least one piece of information included in header information of the frame, and
wherein, in a case of receiving the frame, the action determination unit uses as a search key at least one piece of information included in header information of the frame and, based on identification information of an entry matching the at least one piece of information included in header information of the frame, determines a priority of the received frame in a case of transferring the same as an action related to transferring the received frame.

15. A CAM failure diagnosis method for a communication apparatus configured to transmit and receive a,
wherein the communication apparatus comprises:
an action determination unit configured to determine by referring to the CAM an action related to transferring the received frame, and
a contents addressable memory (CAM) diagnosis unit configured to diagnose a failure at the CAM,
wherein the CAM comprises:
a plurality of entries each storing therein at least a portion of the header information of the frame, and
a search circuit for each entry configured to determine whether or not a search key matches data stored at the entry,
wherein, in a case of receiving the frame, the action determination unit uses, as a search key, at least a portion of the header information of the frame and determines an action related to transferring the received frame based on identification information of an entry matching the at least a portion of the header information of the frame,
wherein the CAM diagnosis unit determines an entry to be a test object,
wherein the CAM diagnosis unit stores a plurality of test patterns which each include a pattern ID, a data pattern, a search key pattern for a test purpose, and an expected search result,
wherein the expected search result has information indicating whether an entry matches the search key for a testing purpose and identification information of an entry matching the search key for a test purpose,
wherein the method comprises:
determining, by the CAM diagnosis unit, an entry to be a test object,
causing, by the CAM diagnosis unit, the CAM to search for an entry matching the search key for a test purpose,
determining, by the CAM diagnosis unit, whether or not a result of the search matches the expected search result correlated to the search key for a test purpose, and
diagnosing, by the CAM diagnosis unit, a failure occurring at the search circuit of an entry to be the test object in a case where it is determined the result of the search does not match the expected search result correlated to the search key for a test purpose.

* * * * *